US012796489B2

(12) United States Patent
Chen et al.

(10) Patent No.: US 12,796,489 B2
(45) Date of Patent: Nov. 10, 2026

(54) PACKAGE STRUCTURE AND FABRICATING METHOD THEREOF

(71) Applicant: Taiwan Semiconductor Manufacturing Company, Ltd., Hsinchu (TW)

(72) Inventors: Wei-Yu Chen, Hsinchu City (TW); Yu-Min Liang, Taoyuan City (TW); Chien-Hsun Lee, Hsin-chu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 728 days.

(21) Appl. No.: 17/889,404

(22) Filed: Aug. 17, 2022

(65) Prior Publication Data

US 2024/0063130 A1 Feb. 22, 2024

(51) Int. Cl.

| | |
|---|---|
| ***H10W 70/60*** | (2026.01) |
| ***H10W 70/05*** | (2026.01) |
| ***H10W 70/685*** | (2026.01) |
| ***H10W 90/00*** | (2026.01) |
| *H10W 74/15* | (2026.01) |

(52) U.S. Cl.

CPC .......... *H10W 70/611* (2026.01); *H10W 70/05* (2026.01); *H10W 70/093* (2026.01); *H10W 70/614* (2026.01); *H10W 70/685* (2026.01); *H10W 90/401* (2026.01); *H10W 90/701* (2026.01); *H10W 74/15* (2026.01); *H10W 90/724* (2026.01); *H10W 90/734* (2026.01)

(58) Field of Classification Search

CPC ............ H01L 23/5385; H01L 21/4853; H01L 21/4857; H01L 23/49811; H01L 23/5383; H01L 23/5389; H01L 24/16; H01L 24/32; H01L 24/73; H01L 2224/16227; H01L 2224/32225; H01L 2224/73204

See application file for complete search history.

(56) References Cited

U.S. PATENT DOCUMENTS

2010/0133704 A1* 6/2010 Marimuthu ......... H01L 23/3128 257/E23.116
2016/0093572 A1* 3/2016 Chen .................. H01L 23/5389 438/126

(Continued)

*Primary Examiner* — Jacob Y Choi
*Assistant Examiner* — Neil R Prasad
(74) *Attorney, Agent, or Firm* — JCIPRNET

(57) ABSTRACT

A package structure including a redistribution circuit structure, a wiring substrate, a conductive pillar and a solder material is provided. The redistribution circuit structure has a first surface and a second surface opposite to the first surface and includes a first insulating layer and a first redistribution pattern in the insulating layer. The first redistribution pattern comprises a first contact pad disposed at the first surface. The wiring substrate is disposed opposite the first surface of the redistribution circuit structure and includes a second insulating layer and a second redistribution pattern in the second insulating layer. The second redistribution pattern comprises a second contact pad. The conductive pillar is disposed between the first contact pad and the second contact pad. The solder material disposed between the conductive pillar and the second contact pad.

20 Claims, 37 Drawing Sheets

(56) References Cited

U.S. PATENT DOCUMENTS

| | | | | |
|---|---|---|---|---|
| 2016/0118333 | A1* | 4/2016 | Lin | H01L 21/6836<br>257/773 |
| 2016/0233189 | A1* | 8/2016 | Shimote | H01L 24/97 |
| 2021/0242122 | A1* | 8/2021 | Jeng | H01L 25/105 |

* cited by examiner

PACKAGE STRUCTURE AND FABRICATING METHOD THEREOF

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for miniaturization, higher speed and greater bandwidth, as well as lower power consumption and latency has grown, there has grown a need for stable packaging techniques of semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
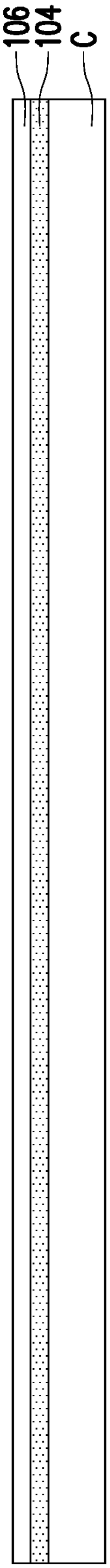
FIG. 1 through FIG. 10 are cross-sectional views schematically illustrating a process flow for fabricating a package structure in accordance with the first embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 through FIG. 10 are cross-sectional views schematically illustrating a process flow for fabricating a package structure in accordance with the first embodiment of the present disclosure.

As illustrated in FIG. 1, a carrier C is provided, and a release layer 104 is formed on the carrier C. The carrier C may be a silicon substrate, a glass carrier, a ceramic carrier, or the like. In some embodiments, the carrier C may be a wafer, such that multiple packages can be formed on the carrier C simultaneously.

The release layer 104 is formed of a polymer-based material, which may be removed along with the carrier C from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier C, or may be the like. The top surface of the release layer 104 may be leveled and may have a high degree of planarity.

After forming the release layer 104, a dielectric layer 106 is formed on the release layer 104. The bottom surface of the dielectric layer 106 may be in contact with the top surface of the release layer 104. In some embodiments, the dielectric layer 106 may comprise a molding compound, such as a polymer, an epoxy, silicon oxide filler material, the like, or a combination thereof. The dielectric layer 106 may be formed by compression molding, transfer molding, or the like. A curing process may be performed to cure the dielectric layer 106 and the curing process may be a thermal curing, a UV curing, the like, or a combination thereof. The dielectric layer 106 may have a substantial degree of transparency. In some embodiments, the dielectric layer 106 has a thickness in a range of about 25 μm to about 50 μm, such as about 50 μm.

Figure 2:
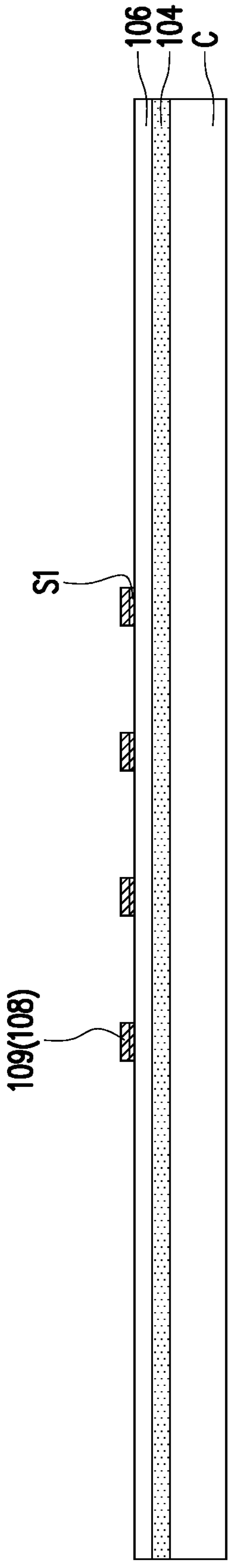

As illustrated in FIG. 2, a metallization pattern 108 is formed on the dielectric layer 106. As an example to form the metallization pattern 108, a seed layer (not shown) is formed over the dielectric layer 106. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist (not shown) is then formed and patterned on the seed layer. The photoresist may be formed by spin coating or the like and may be exposed to light for patterning. The pattern of the photoresist corresponds to the metallization pattern 108. The patterning of the photoresist forms openings through the photoresist to expose the seed layer. A conductive material is subsequently formed in the openings of the photoresist and on the exposed portions of the seed layer. The conductive material may be formed by plating, such as electroplating or electroless plating, or the like. The conductive material may comprise a metal, such as copper, titanium, tungsten, aluminum, or the like. Afterwards, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, for example, using an acceptable etching process, such as by wet or dry etching, to form a patterned seed layer S1. The patterned seed layer S1 and the conductive material on the patterned seed layer S1 form the metallization pattern 108. Portions of the metallization pattern 108 may be used as contact pads 109 in the first package structure 10, which will be discussed in detail below.

Figure 3:
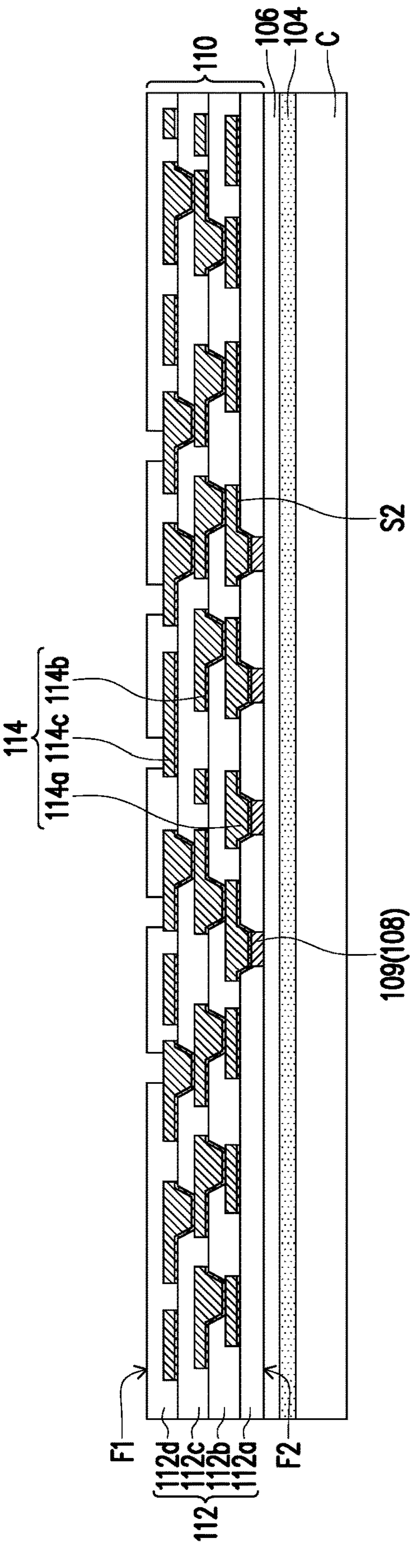

As illustrated in FIG. 3, a redistribution circuit structure 110 is formed over the dielectric layer 106 and the carrier C. The redistribution circuit structure 110 may include stacked insulating layers 112 and redistribution patterns 114 embedded in the stacked insulating layers 112. For example, an insulating layer 112*a* is formed on the dielectric layer 106 and the metallization pattern 108. The insulating layer 112*a* may have openings and portions of the metallization pattern 108 are revealed by the openings defined in the insulating layer 112*a*. In some embodiments, the material of the insulating layer 112*a* includes polybenzoxazole (PBO), polyimide (PI) or other suitable polymer dielectric material. In some alternative embodiments, the material of the insulating layer 112*a* includes resin mixed with filler. The insulating layer 112*a* may be formed by photo-patternable material and patterned by a photolithography process.

After forming the insulating layer 112*a*, redistribution patterns 114*a* are formed in the openings and cover the revealed portions of the metallization pattern 108. For example, a blank seed layer (not shown) may be formed over the carrier C to cover the insulating layer 112*a* and the portions of the metallization pattern 108 that are revealed by the openings defined in the insulating layer 112*a*. The blank seed layer may be sputtered Ti/Cu seed layer which entirely covers the insulating layer 112*a*. After forming the blank seed layer, a patterned photoresist layer (not shown) is formed on the blank seed layer. The patterned photoresist layer may include trenches, and portions of the blank seed layer are revealed by the trenches defined in the patterned photoresist layer. After the patterned photoresist layer is formed on the blank seed layer, a plating process may be performed by using the patterned photoresist layer as a mask such that redistribution patterns 114*a* are plated in the trench and cover the revealed portions of the blank seed layer. After forming the redistribution patterns 114*a*, the patterned photoresist layer is removed such that portions of the blank seed layer that are not covered by the redistribution patterns 114*a* are revealed, and a patterned seed layer S2 is formed under the redistribution patterns 114*a*. An etching process may be performed to remove the portions of the blank seed layer that are not covered by the redistribution patterns 114*a* until portions of the insulating layer 112*a* are revealed. As illustrated in FIG. 3, the redistribution patterns 114*a* and the patterned seed layer S2 may be considered as a layer of redistribution patterns.

After the insulating layer 112*a* and the redistribution patterns 114*a* are formed, an insulating layer 112*b*, redistribution patterns 114*b*, an insulating layer 112*c*, redistribution patterns 114*c* and an insulating layer 112*d* may be formed over the carrier C such that the redistribution circuit structure 110 is formed. The fabrication process of the insulating layer 112*b*, the insulating layer 112*c* and the insulating layer 112*d* may be similar to that of the insulating layer 112*a*. The fabrication process of the redistribution patterns 114*b* and the redistribution patterns 114*c* may be similar to that of the redistribution patterns 114*a*. The number of insulating layers 112 and redistribution patterns 114 in the redistribution circuit structure 110 may be modified in accordance with design rule of products. For the ease of illustration, the redistribution circuit structure 110 may have a first surface F1 at the side of the insulating layer 112*d* and a second surface F2 at the side of the insulating layer 112*a*, and the second surface F2 is opposite to the first surface F1.

The redistribution patterns 114 may include contact pads, conductive wirings and conductive vias electrically connected between the conductive wirings and between the conductive wiring and the contact pad, wherein the conductive wirings may transmit signal horizontally, the conductive vias may transmit signal vertically, and the contact pads may be provided for external connection. The material of the redistribution patterns 114 may include copper or other suitable metallic materials.

Figure 4:
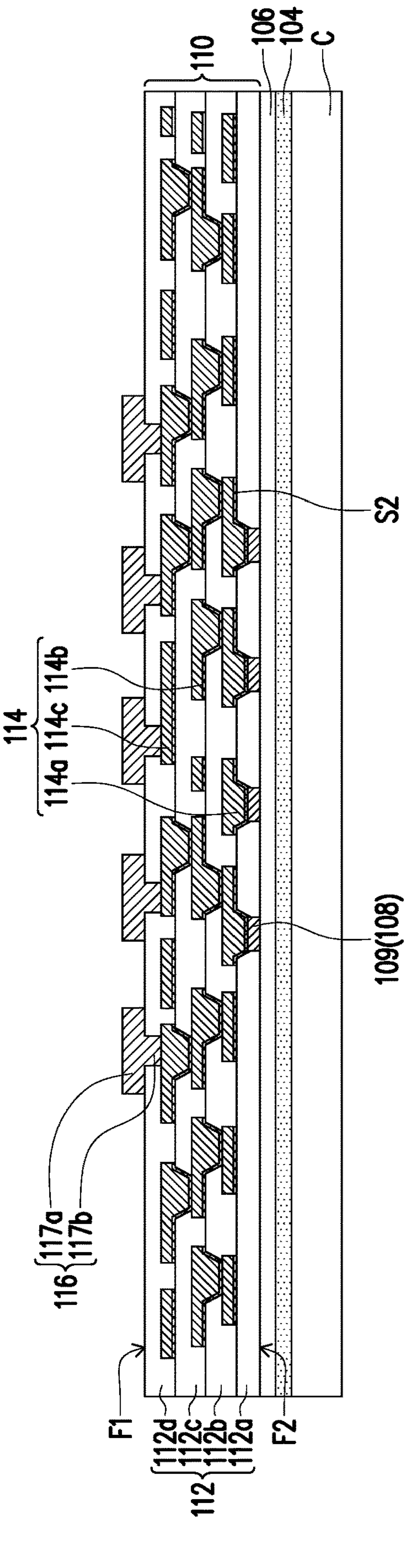

Referring to FIG. 4, redistribution patterns 116 of the redistribution circuit structure 110 are formed for external connection to the first surface F1 of the redistribution circuit structure 110. In some embodiments, the redistribution patterns 116 include under-bump metallurgies (UBMs) serving as contact pads for external connection to the redistribution circuit structure 110. In some embodiments, the redistribution patterns 116 include contact pads 117*a* on and extending along the major surface of the insulating layer 112*d* and via portions 117*b* extending through the insulating layer 112*d* to physically and electrically couple to the redistribution patterns 114*c*. As a result, the redistribution patterns 116 are electrically coupled to the metallization pattern 108. In some embodiments, the redistribution patterns 116 are formed of the same material as the metallization pattern 108 or the redistribution patterns 114.

Figure 5:
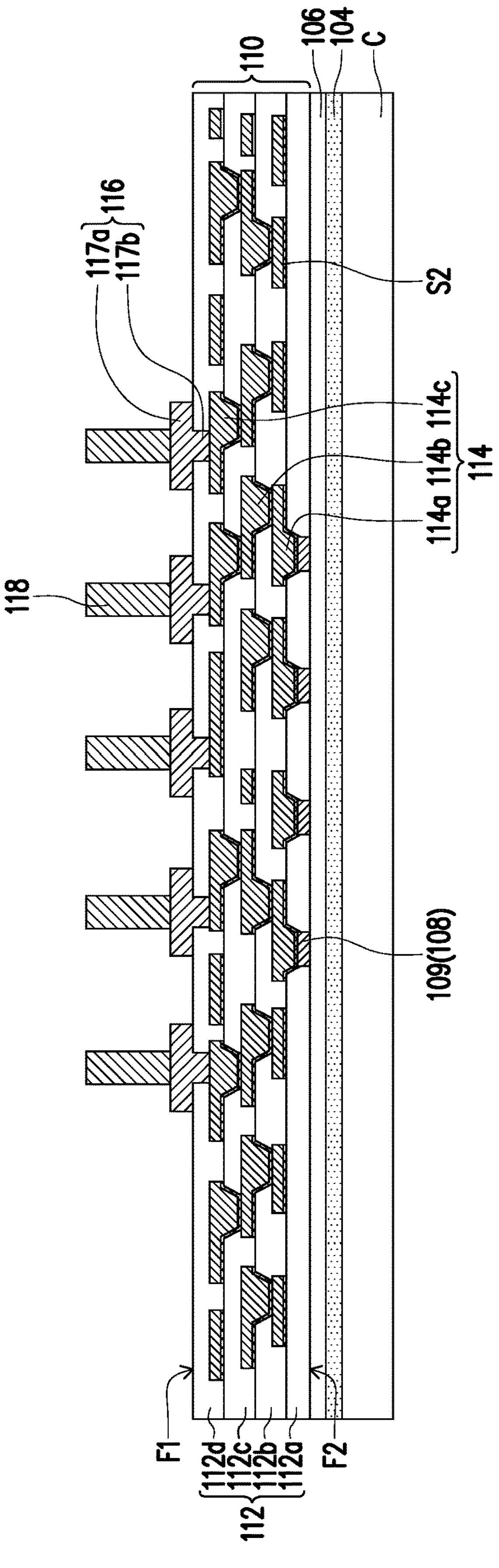

In FIG. 5, conductive pillars 118 are formed on and electrically connected to the redistribution patterns 116. The conductive pillars 118 may include a conductive material such as solder, copper, aluminum, gold, nickel, silver, palladium, tin, the like, or a combination thereof. In some embodiments, the conductive pillars 118 comprise metal pillars (such as a copper pillar) formed by sputtering, printing, electro plating, electroless plating, CVD, or the like and subsequent dry film development. The metal pillars may be solder free and have substantially vertical sidewalls. In certain embodiments, a metal cap layer is formed on the top of the conductive pillars 118. The metal cap layer may include nickel, tin, tin-lead, gold, silver, palladium, indium, nickel-palladium-gold, nickel-gold, the like, or a combination thereof and may be formed by a plating process.

Figure 6A:
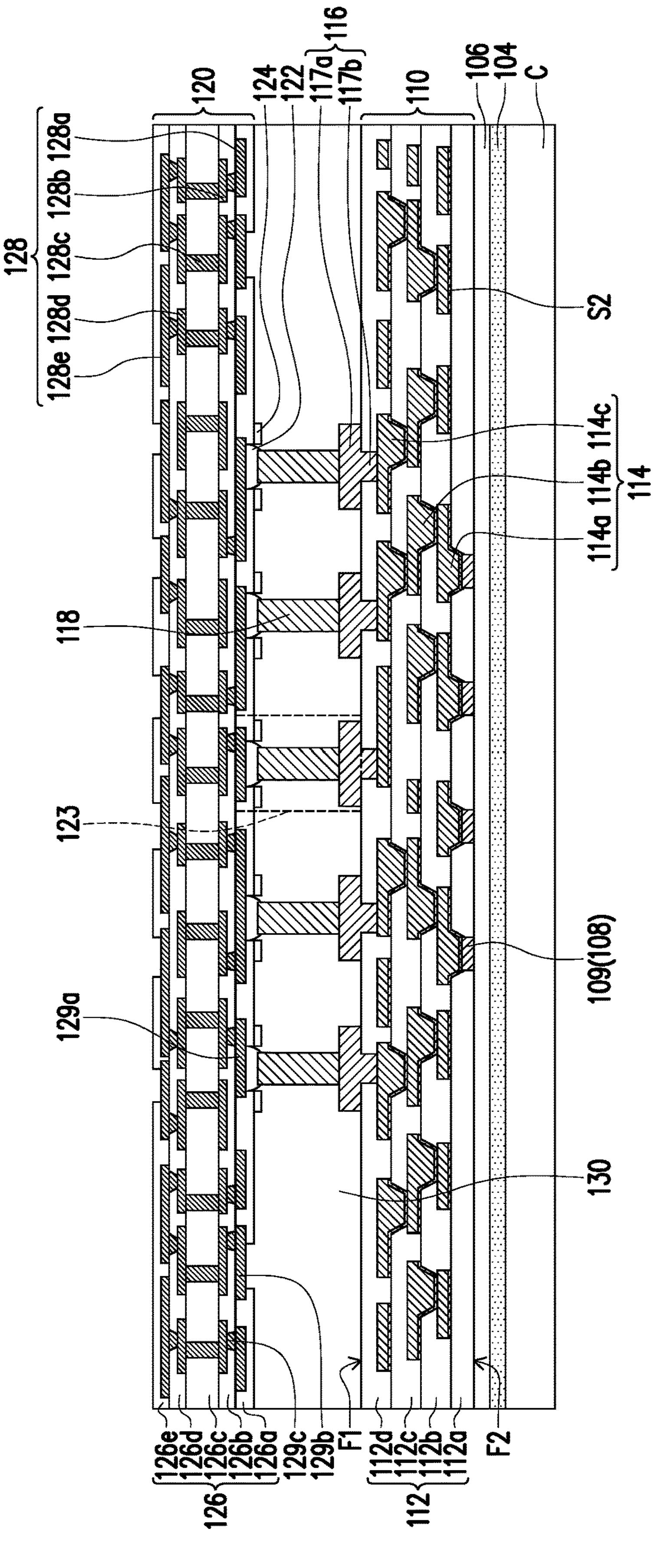

Referring to FIG. 6A, a wiring substrate 120 is provided over the conductive pillars 118 such that the conductive pillars 118 electrically connect the wiring substrate 120 with the redistribution circuit structure 110. The wiring substrate 120 may include insulating layers 126 and redistribution patterns 128. The number of insulating layers 126 and redistribution patterns 128 in the wiring substrate 120 may be modified in accordance with design rule of products. For example, as illustrated in FIG. 6A, the wiring substrate 120 includes five insulating layers, i.e. insulating layers 126*a* to 126*e*, stacked in sequence and redistribution patterns 128*a* to 128*e* formed in the insulating layers 126*a* to 126*e* respectively. The redistribution patterns 128*a* may include contact pads 129*a*, conductive wirings 129*b* and conductive vias 129*c* electrically connected between the contact pads 129*a* and the redistribution patterns 128*b* or between the conductive wirings 129*b* and the redistribution patterns 128*b*, wherein the conductive wirings 129*b* may transmit signal horizontally, the conductive vias 129*c* may transmit signal vertically, and the contact pads 129*a* may be provided for external connection. The material of the redistribution patterns 128 may include copper or other suitable conductive materials.

The wiring substrate 120 may further include a solder material 122 formed on and electrically connected to the contact pads 129*a* of the redistribution patterns 128*a*. The solder material 122 is distributed on the contact pads 129*a* of the wiring substrate 120 facing the conductive pillars 118. The solder material 122 may include solder posts or solder bumps. The wiring substrate 120 may be placed onto the conductive pillars 118 such that the solder posts or solder bumps of the solder material 122 disposed on the contact pads 129*a* align with and contact the conductive pillars 118. A reflow process is performed such that the wiring substrate 120 can be electrically connected to the redistribution patterns 116 of the redistribution circuit structure 110 through the solder material 122 and the conductive pillars 118. In some embodiments, a melting point of the conductive pillar 118 is higher than a melting point of the solder material 122.

Figure 6B:
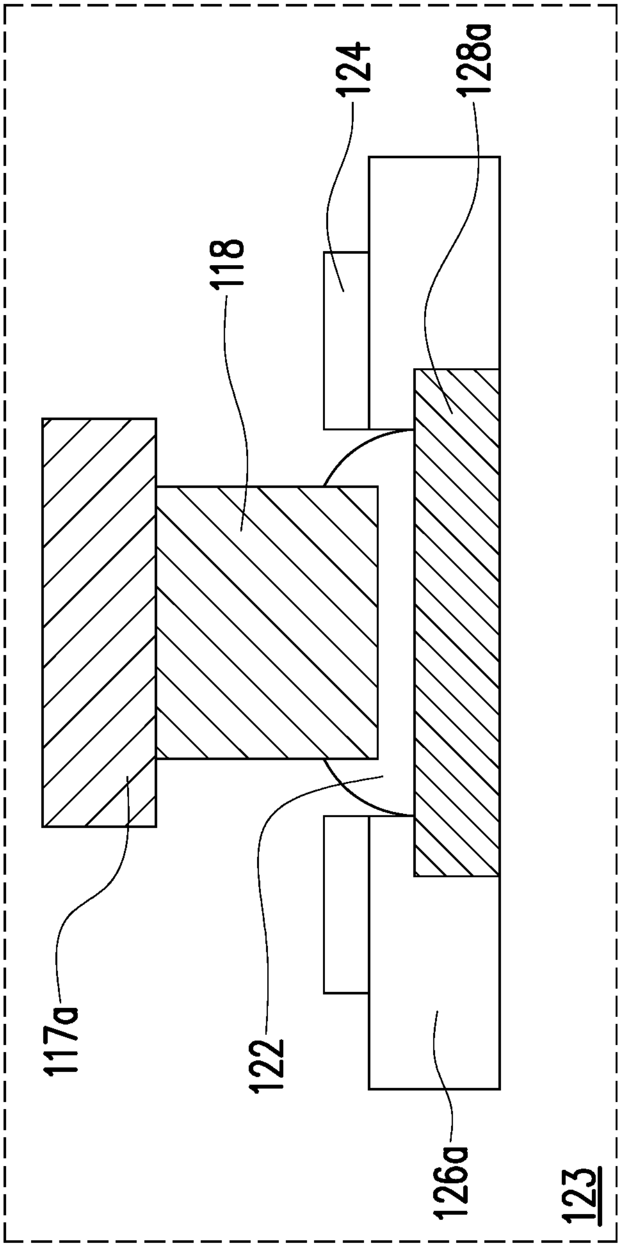
Figure 7:
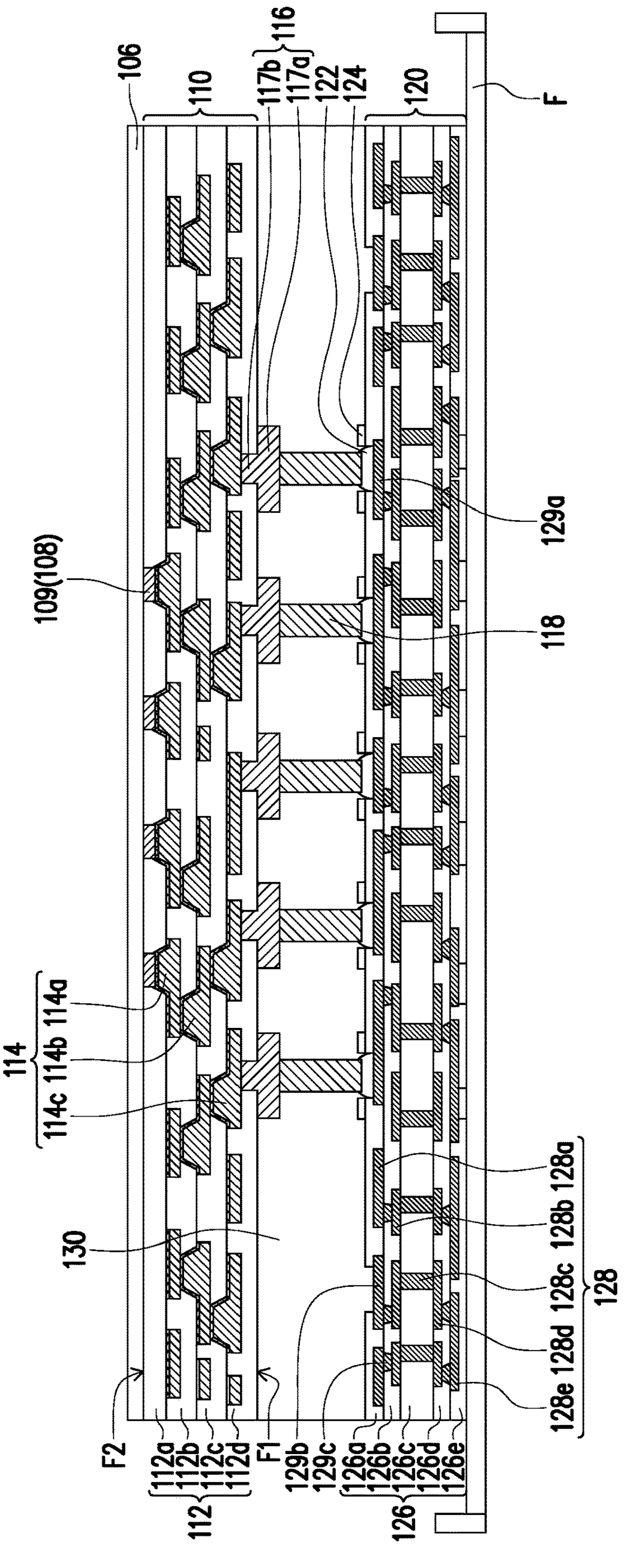

One contact pad 117*a*, one conductive pillar 118 and one solder post or solder bump of the solder material 122 are collectively referred to as an interconnect structure 123, which may function as a support structure as discussed in detail below. FIG. 6B shows the interconnect structure 123 in detail, which includes the contact pad 117*a*, the conductive pillar 118 and the solder material 122 stacked on the contact pads 129*a* of the redistribution pattern 128*a* of the wiring substrate 120. In some embodiments, the wiring substrate 120 may further include a solder resist or a solder mask layer 124 surrounding the solder material 122 for preventing unnecessary electrical connection with the solder material 122 during the reflow process, so that the solder material 122 connects with the conductive pillars 118 only. After the wiring substrate 120 is mounted on the redistribution circuit structure 110 carried by the carrier C, a space is formed between the wiring substrate 120 and the first surface S1 of the redistribution circuit structure 110 due to the conductive pillars 118. In other words, the first surface S1 of the redistribution circuit structure 110 is separated from the wiring substrate 120 by a predetermined distance resulted from the conductive pillars 118. For example, the predetermined distance between the first surfaces S1 of the redistribution circuit structure 110 and the wiring substrate 120 ranges from about 300 micrometers to about 600 micrometers. Accordingly, warpage issues of the redistribution circuit structure 110 and the wiring substrate 120 can be minimized to improve the co-planarity of the redistribution circuit structure 110 and the wiring substrate 120, and delamination issue can be minimized to enhance the join yield and reliability of the package structure 10.

As illustrated in FIG. 6A, an insulating encapsulation 130 is formed over the redistribution circuit structure 110 to fill the space between the redistribution circuit structure 110 and the wiring substrate 120 and laterally encapsulate the conductive pillars 118 and the solder material 122 such that reliability of the conductive pillars 118 and the solder material 122 may be enhanced. The material of the insulating encapsulation 130 may include an underfill (UF) or molded underfill (MUF) material. In some embodiments, the material of the insulating encapsulation 130 may include a resin (e.g., epoxy resin), a filler material, a stress release agent (SRA), an adhesion promoter, phenolic hardeners, silicas, catalysts, pigments, mold release agents, other material, or a combination thereof Referring to FIG. 7, after forming the insulating encapsulation 130, a de-bonding process is performed such that a resulted structure including the dielectric layer 106, the metallization pattern 108, the redistribution circuit structure 110, the conductive pillars 118, the wiring substrate 120 and the insulating encapsulation 130 can be de-bonded from the carrier C. After performing the de-bonding process, a frame mount process is performed to mount the resulted structure on a frame F. The resulted structure de-bonded from the carrier C is flipped upside down and mounted onto the frame F such that the dielectric layer 106 on a second surface S2 of the redistribution circuit structure 110 is revealed, wherein the second surface S2 of the redistribution circuit structure 110 is opposite to the first surface S1 of the redistribution circuit structure 110.

Figure 8:
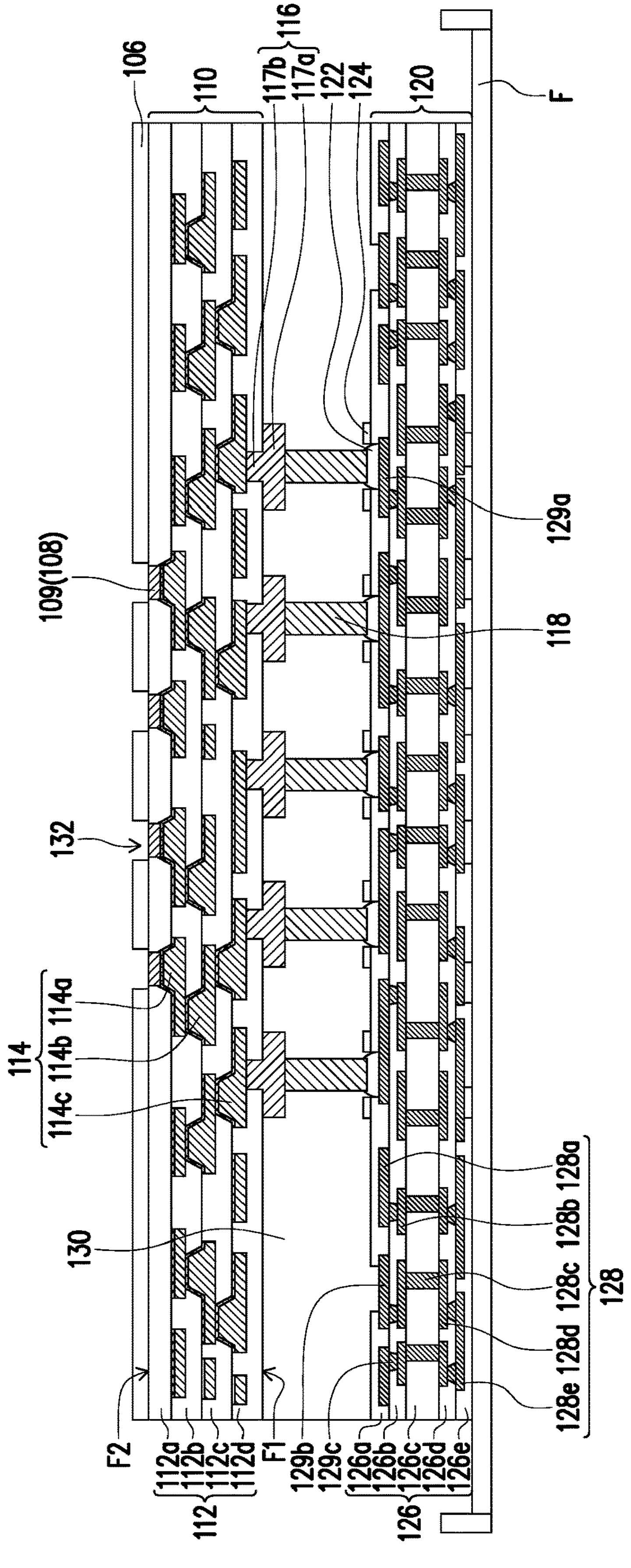

As illustrated in FIG. 8, after performing the frame mount process, plural openings 132 are formed in the dielectric layer 106 to expose the contact pads 109 of the metallization pattern 108. The openings 132 may be formed by using an acceptable etching process, such as by dry etching, or by laser drilling process.

Figure 9:
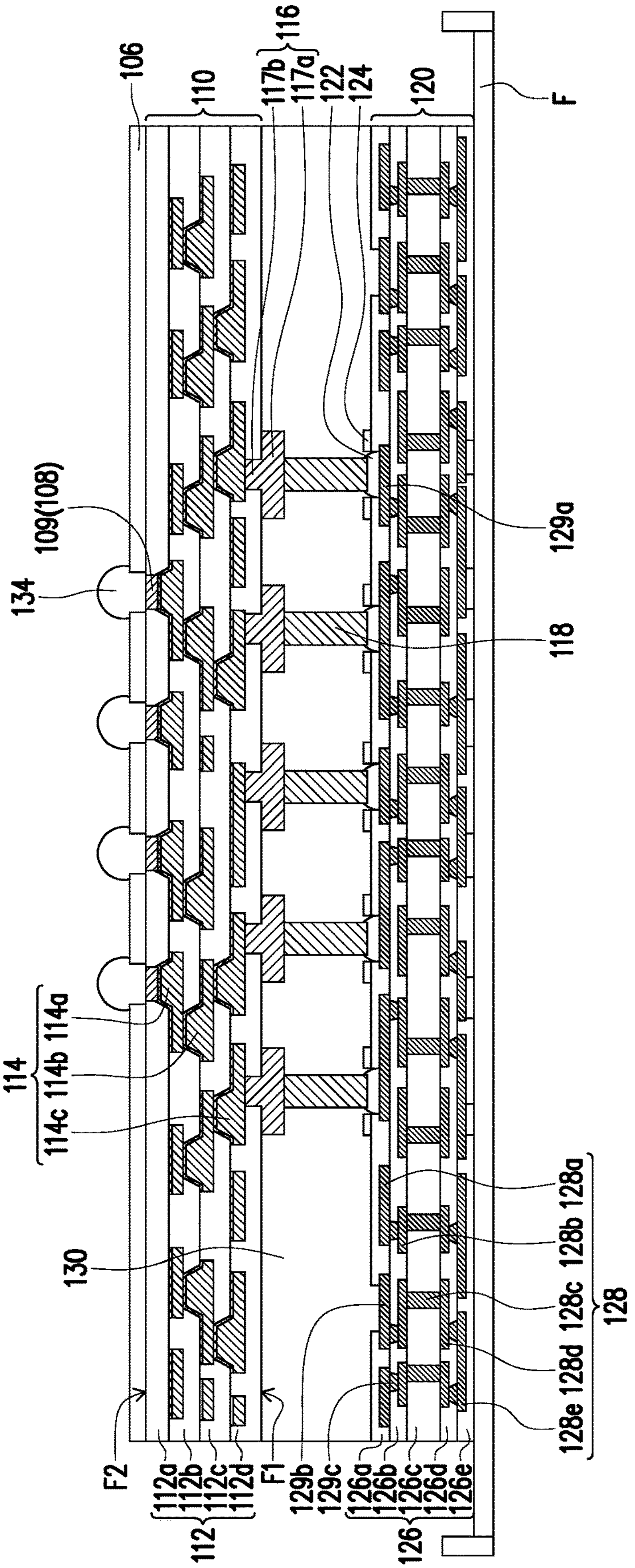

Referring to FIG. 9, conductive terminals 134 are formed on the contact pads 109. The conductive terminals 134 may be solder balls, solder bumps, electroless nickel-electroless palladium-immersion gold technique (ENEPIG) formed bumps, or the like. The conductive terminals 134 may include controlled collapse chip connection (C4) bumps. The conductive terminals 134 may include a conductive material such as solder, copper, aluminum, gold, nickel, silver, palladium, tin, the like, or a combination thereof. In some embodiments, the conductive terminals 134 are formed by initially forming a layer of solder through evaporation, electroplating, printing, solder transfer, ball placement, or the like. Once a layer of solder has been formed on the structure, a reflow process may be performed in order to shape the material into the desired bump shapes.

Figure 10:
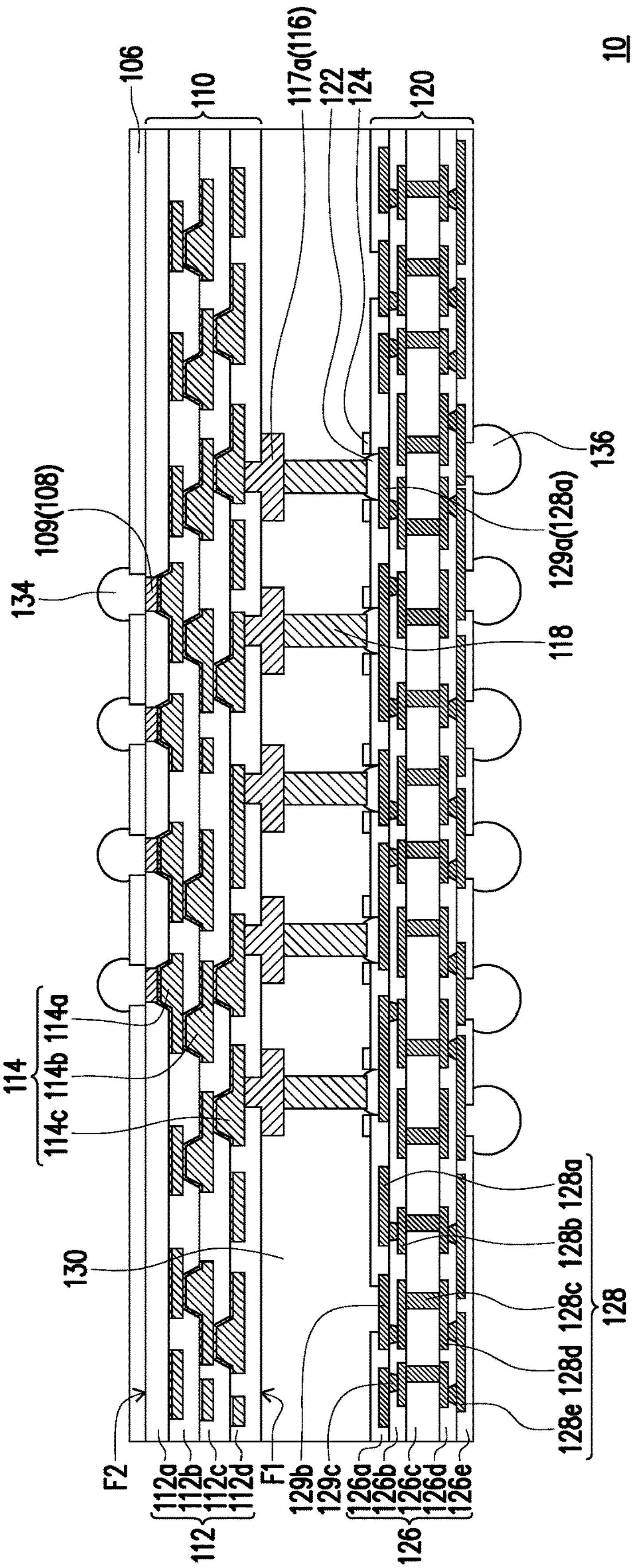

Referring to FIG. 10, the conductive terminals 136 are formed on the surface of the wiring substrate 120 away from the redistribution circuit structure 110, resulting in a package structure 10 in accordance with the first embodiment of the present disclosure. The conductive terminals 136 may be formed of conductive materials in the openings of the insulating layer 112*d*. In some embodiments, the conductive terminals 136 comprise flux and are formed in a flux dipping process. In some embodiments, the conductive terminals 136 comprise a conductive paste such as solder paste, silver paste, or the like, and are dispensed by a printing process. In some embodiments, the conductive terminals 136 are formed in a manner similar to the conductive terminals 134, and may be formed of a similar material as the conductive terminals 134. The dimension of the conductive terminals 136 may be greater than that of the conductive terminals 134. In some embodiments, the conductive terminals 136 include ball-grid array (BGA) balls. The conductive terminals 136 may be solder balls arranged in array.

As illustrated in FIG. 10, the package structure 10 includes a redistribution circuit structure 110, a wiring substrate 120, a conductive pillar 118 and a solder material 122. The redistribution circuit structure 110 has a first surface F1 and a second surface F2 opposite to the first surface F1. The redistribution circuit structure 110 includes an insulating layer 112*d* and a redistribution pattern 116 in the insulating layer 112*d*, wherein the redistribution pattern 116 comprises a contact pad 117*a* disposed at the first surface F1. The wiring substrate 120 is disposed opposite the first surface F1 of the redistribution circuit structure 110. The wiring substrate 120 includes an insulating layer 126*a* and a redistribution pattern 128*a* in the insulating layer 126*a*, wherein the redistribution pattern 128*a* comprises a contact pad 129*a*. The conductive pillar 118 is disposed between the contact pad 117*a* and the second contact pad 129*a*, and the solder material 122 is disposed between the conductive pillar 118 and the contact pad 129*a*.

FIG. 11 through FIG. 18 are cross-sectional views schematically illustrating a process flow for fabricating a package structure in accordance with the second embodiment of the present disclosure. Processes illustrated in FIG. 11 through FIG. 18 are performed after the processes illustrated in FIG. 1 through FIG. 4. Processes illustrated in FIG. 13 through FIG. 17 are similar to those illustrated in FIG. 6A through FIG. 10, and descriptions regarding to the processes illustrated in FIG. 13 through FIG. 17 are thus omitted.

Figure 11:
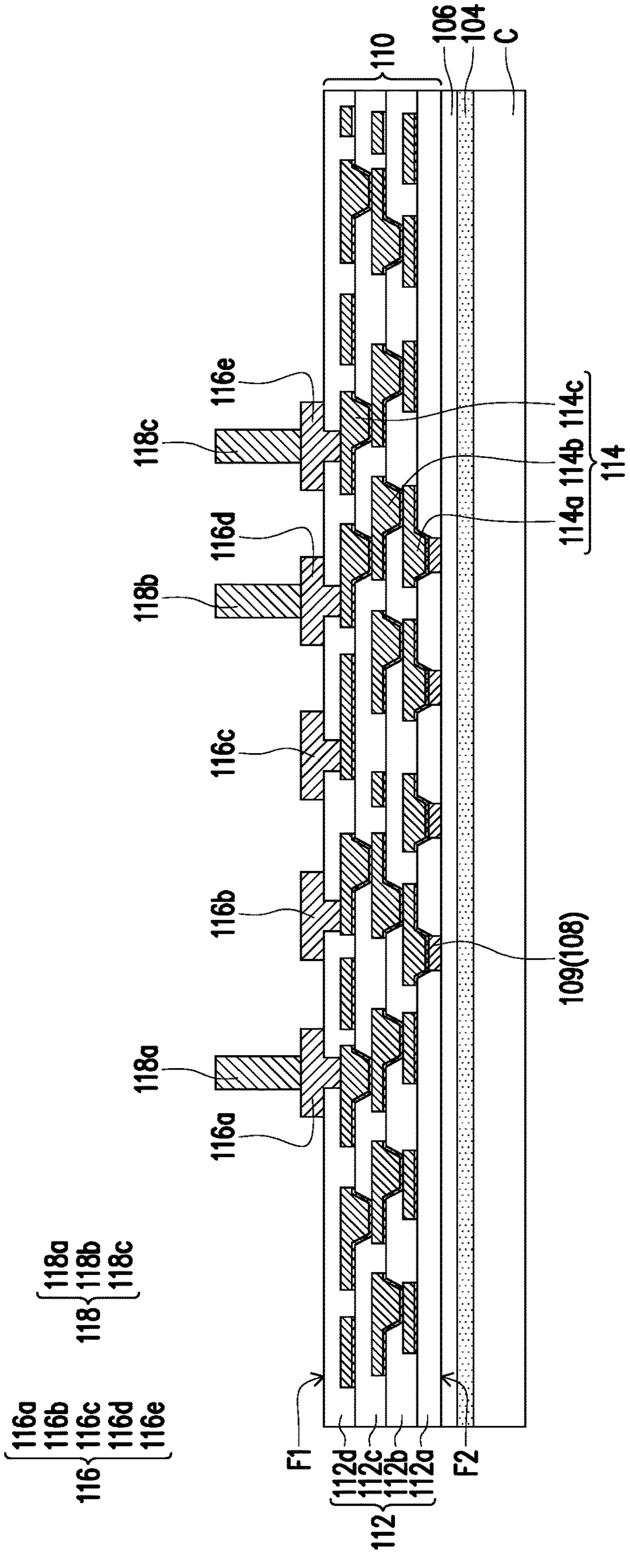
FIG. 11 through FIG. 18 are cross-sectional views schematically illustrating a process flow for fabricating a package structure in accordance with the second embodiment of the present disclosure.

Referring to FIG. 4 and FIG. 11, the conductive pillars 118 are formed on the redistribution patterns 116. For example, as shown in FIG. 11, the redistribution patterns 116 may include the redistribution patterns 116*a*, 116*b*, 116*c*, 116*d* and 116*e*. The conductive pillars 118 may include the conductive pillars 118*a*, 118*b* and 118*c*. The conductive pillars 118*a*, 118*b* and 118*c* are formed on the redistribution patterns 116*a*, 116*d* and 116*e* respectively, and the conductive pillars 118 are not formed on the redistribution patterns 116*b* and 116*c*.

Figure 12:
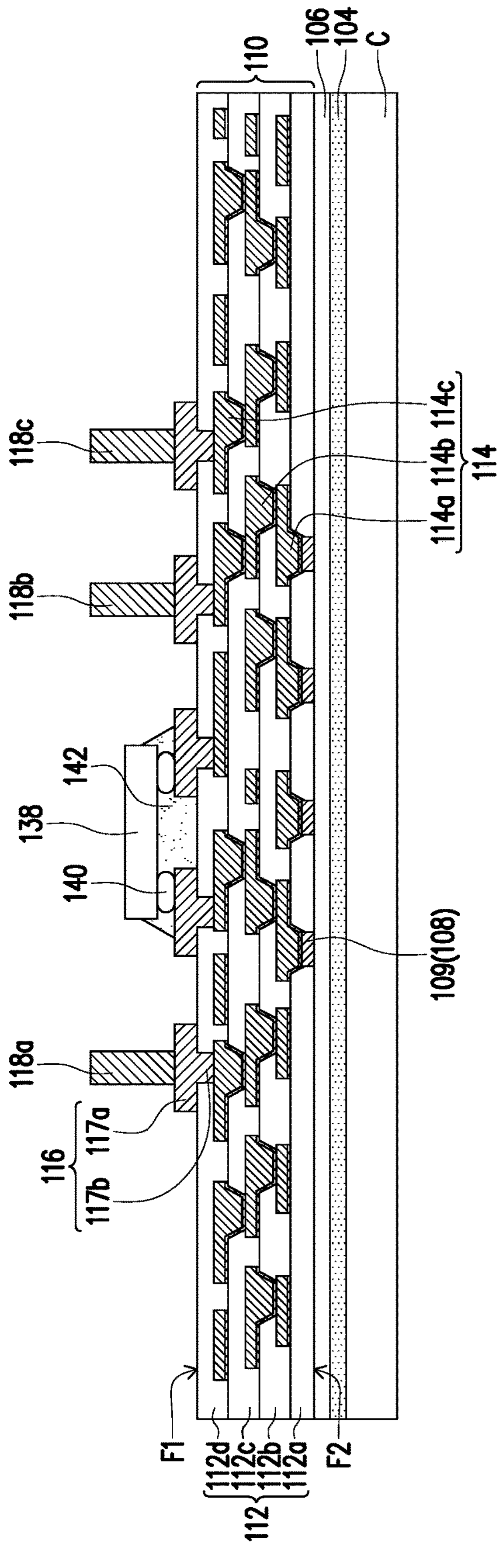

In FIG. 12, a semiconductor device 138 is mounted over the first surface F1 of the redistribution circuit structure 110. For example, the semiconductor device 138 is bonded to the contact pads 117*a* of the redistribution patterns 116*b* and 116*c* through conductive connectors 140, such as solder balls or solder bumps. The semiconductor device 138 may be or may comprise a passive device, such as a filter, an integrated passive device (IPD), a Si bridge, a Si bus, a resonator, a capacitor, a resistor, an inductor, or the like, or may include the combinations of the passive devices. The conductive pillar 118 has a height H1 greater than a height H2 of the semiconductor device 138. For example, the height H2 of the semiconductor device 138 ranges from 150 micrometers to 250 micrometers, whereas the height H1 of the conductive pillar 118 ranges from 300 micrometers to 500 micrometers.

In some embodiments, an underfill 142 is formed between the semiconductor device 138 and the insulating layer 112*d*, surrounding the conductive connectors 140. The underfill 142 may reduce stress and protect the joints resulting from the reflowing of the conductive connectors 140. The underfill 142 may be formed by a capillary flow process after the semiconductor device 138 is attached, or may be formed by a suitable dispensing method before the semiconductor device 138 is attached.

Figure 16:
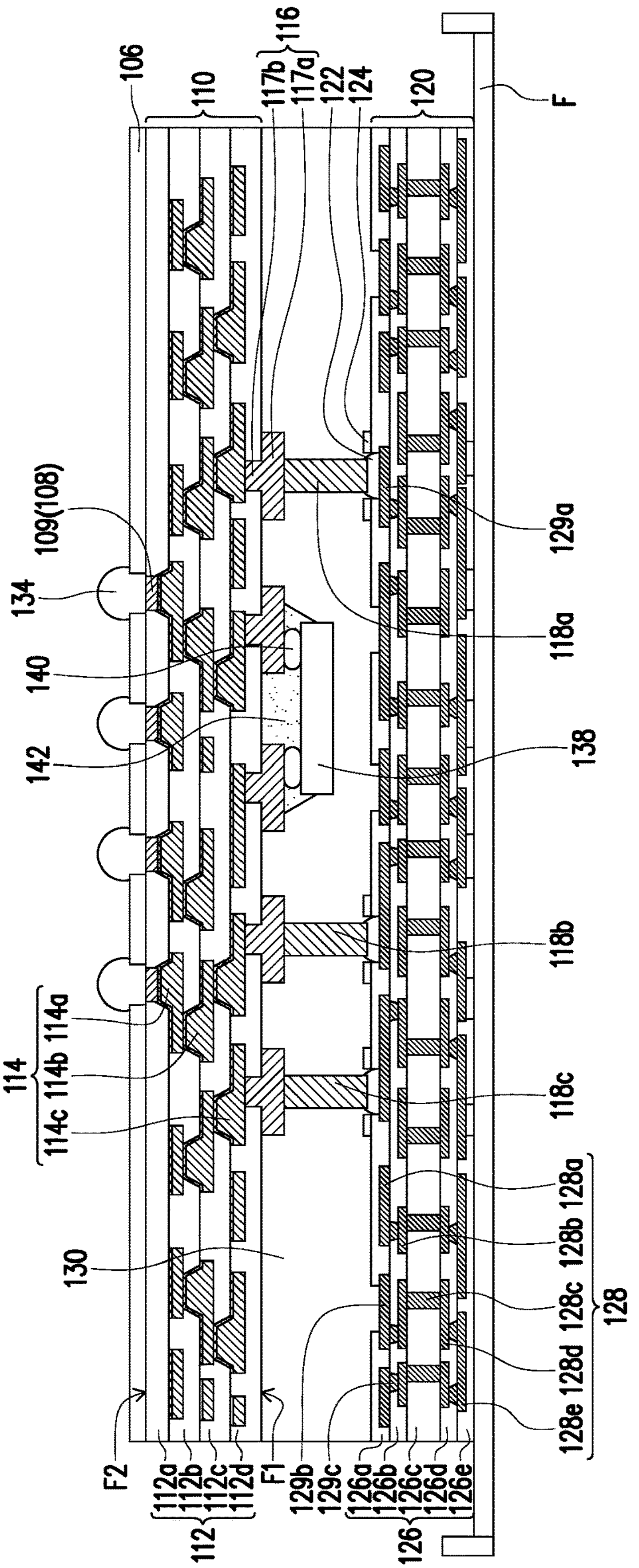
Figure 17:
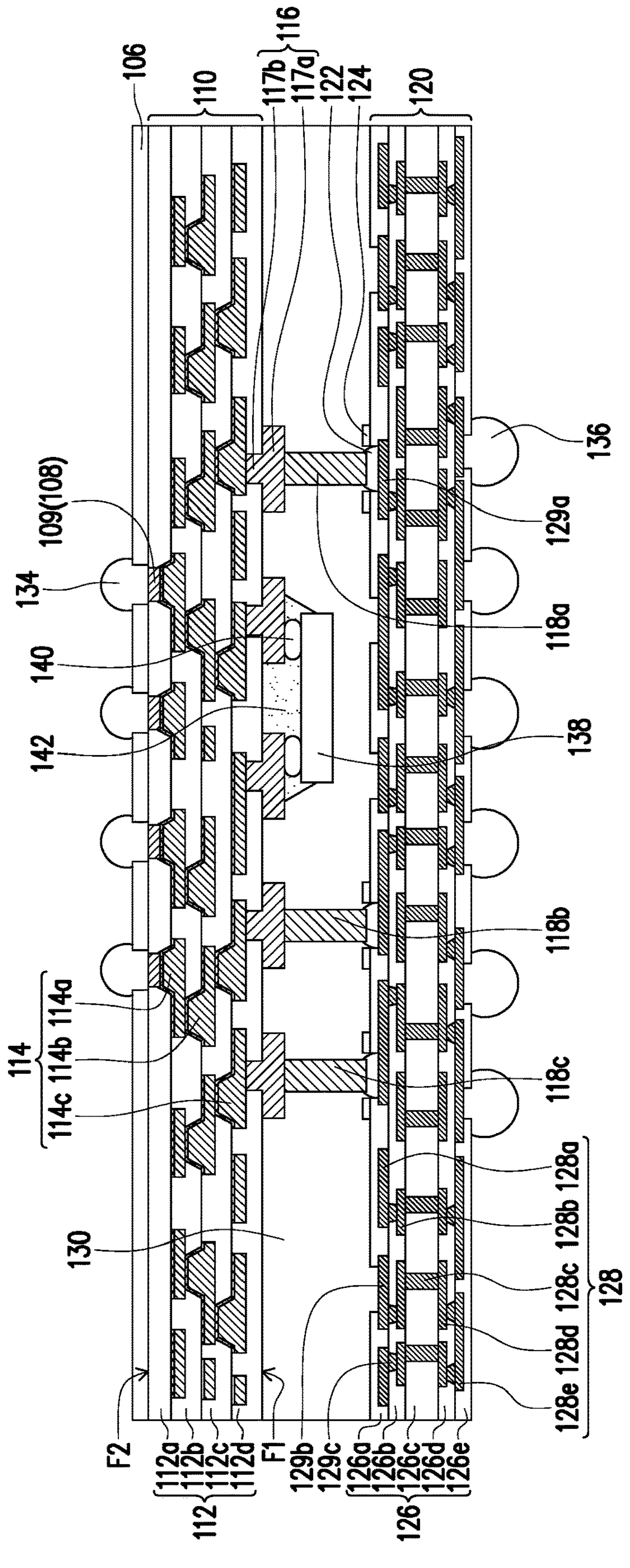
Figure 18:
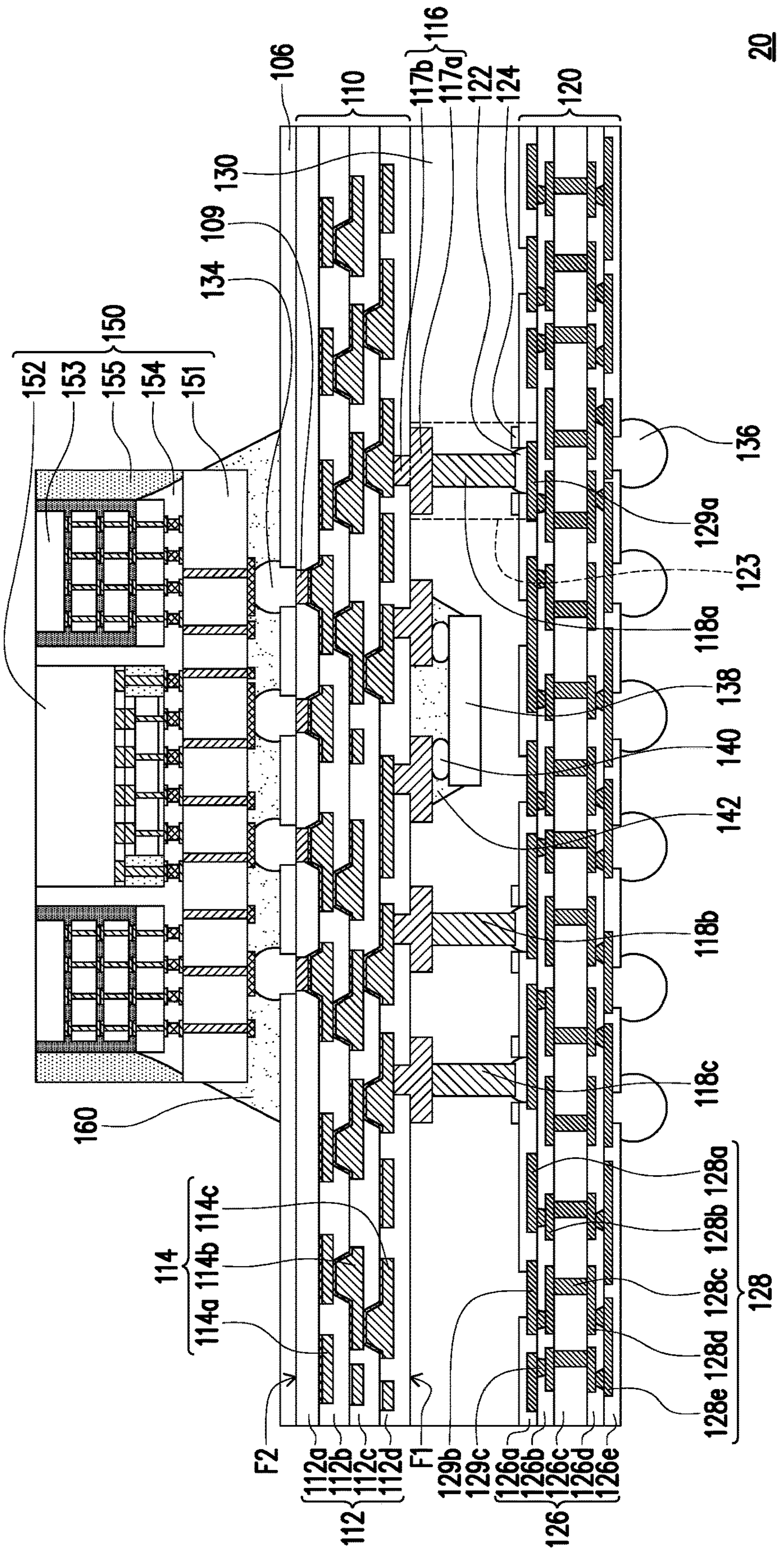

Referring to FIGS. 16 through 18, after the conductive terminals 134 are formed on the contact pads 109 and the conductive terminals 136 are formed on the wiring substrate 120, a chip package 150 is provided and disposed over the second surface F2 of the redistribution circuit structure 110, wherein the chip package 150 is electrically connected to the wiring substrate 120 through the redistribution circuit structure 110.

The chip package 150 is provided and mounted on the redistribution circuit structure 110 through a chip-to-wafer bonding process, for example, such that the chip package 150 is electrically connected to the redistribution patterns 114 in the redistribution circuit structure 110. In some embodiments, the chip package 150 may include an interposer 151, a semiconductor chip 152, memory cubes 153, an underfill 154 and an insulating encapsulation 155. The semiconductor chip 152 and the memory cubes 153 may be disposed on the top surface of the interposer 151. The semiconductor chip 152 and the memory cubes 153 may be electrically connected to the interposer 151 through conductive bumps (e.g., micro-bumps). The underfill may 154 fill the space between the interposer 151 and the semiconductor chip 152 as well as the space between the interposer 151 and the memory cubes 153. The insulating encapsulation 155 encapsulates the semiconductor chip 152, the memory cubes 153 and the underfill 154. The conductive terminals 134 are sandwiched between the interposer 151 and the contact pads 109.

The interposer 151 may be a semiconductor interposer (e.g., a silicon interposer) including through semiconductor vias (e.g. through silicon vias). The semiconductor chip 152 may be logic die, a system on chip (SOC) die or other suitable semiconductor die. In some embodiments, the semiconductor chip 152 may be an system on integrated circuit (SoIC) structure including multiple hybrid bonded and stacked semiconductor chips, wherein the semiconductor chips may be different in width. The semiconductor chip 152 may include a first chip, a second chip and an insulating encapsulation, wherein the first chip is encapsulated by the insulating encapsulation and hybrid bonded with the second chip. The memory cubes 153 may include high bandwidth memory (HBM) cubes or other suitable memory device. The material of the underfill 154 is an insulating material and may include a resin (e.g., epoxy resin), a filler material, a stress release agent (SRA), an adhesion promoter, other material, or a combination thereof. The material of the insulating encapsulation 155 may include molding compound or molded underfill (MUF). In some embodiments, the material of the insulating encapsulation 155 may include epoxy resins, phenolic hardeners, silicas, catalysts, pigments, mold release agents and so on.

As illustrated in FIG. 18, after the at least one chip package 150 is mounted on the redistribution circuit structure 110 through the conductive terminals 134, an underfill 160 may be formed on the dielectric layer 106 so as to fill a space between the at least one chip package 150 and the dielectric layer 106, thereby obtaining package structure 20. In addition, the underfill 160 may further cover sidewalls of the at least one chip package 150. The material of the underfill 160 is an insulating material and may include a resin (e.g., epoxy resin), a filler material, a stress release agent (SRA), an adhesion promoter, other material, or a combination thereof. In some embodiments, a singulation process is further performed to singulate the package structure 20.

As illustrated in FIG. 18, the package structure 20 includes a wiring substrate 120, a redistribution circuit structure 110 electrically connected to the wiring substrate 120 through an interconnect structure 123, a semiconductor device 138 disposed between the redistribution circuit structure 110 and the wiring substrate 120, and a chip package 150 disposed over and electrically connected to the second surface F2 of the redistribution circuit structure 110. In some embodiments, the package structure 20 further includes an insulating encapsulation 130 disposed between the redistribution circuit structure 110 and the wiring substrate 120 and laterally encapsulating the conductive pillars 118, the solder material 122 and the semiconductor device 138. In some embodiments, the interconnect structure 123 includes the contact pad 117*a*, the conductive pillar 118 and the solder material 122. Due to the disposition of the conductive pillars 118, a predetermined distance can be maintained between the redistribution circuit structure 110 and the wiring substrate 120, thereby enabling the disposition of the semiconductor device 138 between the redistribution circuit structure 110 and the wiring substrate 120. In some embodiments, the package structure 20 may be referred to as a Chip-on-Wafer-on-Substrate (CoWoS) package.

Figure 19:
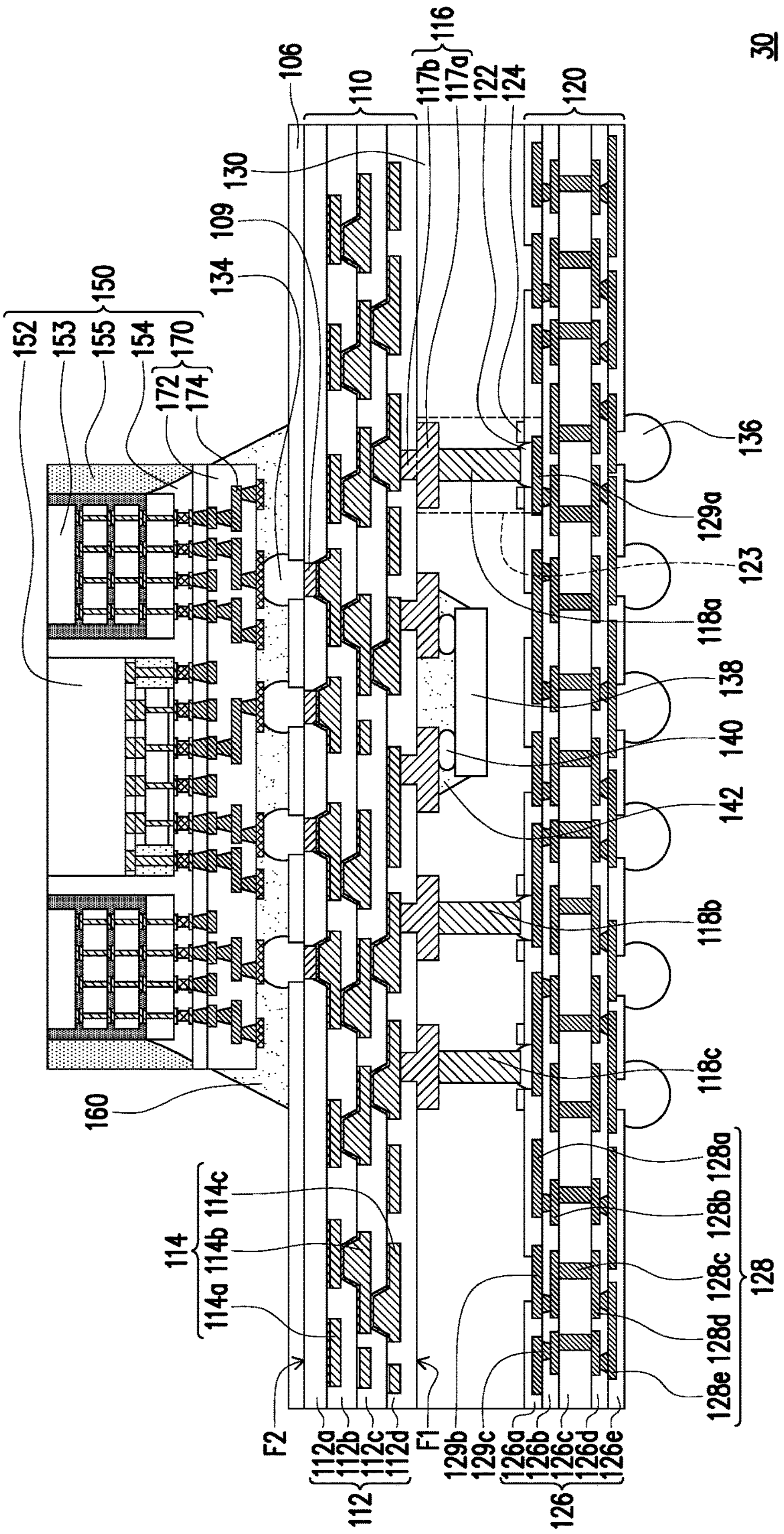
FIG. 19 is a cross-sectional view schematically illustrating a package structure in accordance with the third embodiment of the present disclosure.

FIG. 19 is a cross-sectional view schematically illustrating a package structure in accordance with the third embodiment of the present disclosure.

Referring to FIG. 18 and FIG. 19, the package structure 30 illustrated in FIG. 19 is similar to the package structure 20 illustrated in FIG. 18 except that the interposer 151 is replaced with an integration fan-out redistribution layer (InFO RDL) 170. The InFO RDL 170 may comprise insulating layers 172 and redistribution patterns 174 embedded in the insulating layers 172. The insulating layers 172 may comprise the same insulating material as the insulating layer 112, and the redistribution patterns 174 may comprise the same conductive material as the redistribution pattern 114. The InFO RDL layer 170 support electrical signals and can be used to connect the semiconductor chip 152 and memory cubes 153 with the conductive terminals 134. The InFO RDL 170 provides electrical connections for the redistribution circuit structure 110 through the conductive terminals 134 on the second surface F2 of the redistribution circuit structure 110.

FIG. 20 through FIG. 33 are cross-sectional views schematically illustrating a process flow for fabricating a package structure in accordance with the fourth embodiment of the present disclosure.

Figure 20:
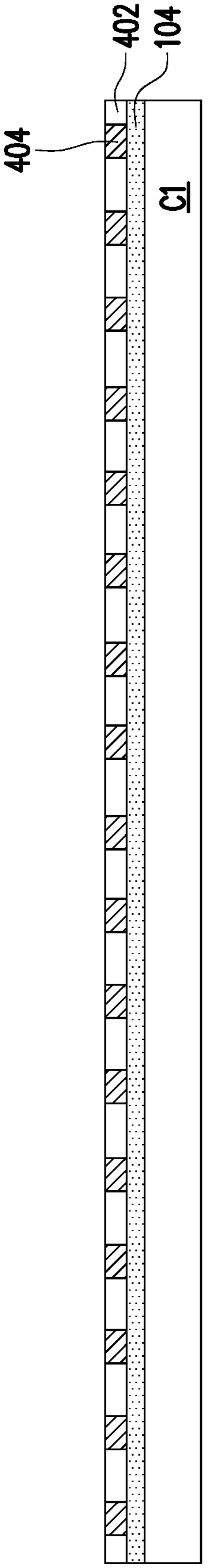
FIG. 20 through FIG. 33 are cross-sectional views schematically illustrating a process flow for fabricating a package structure in accordance with the fourth embodiments of the present disclosure.

Referring to FIG. 20, a carrier C1 is provided, and a release layer 104 is formed on the carrier C1. The carrier C1 may be a glass carrier, a ceramic carrier, or the like. The carrier C1 may be a wafer, such that multiple packages can be formed on the carrier C1 simultaneously.

A release layer 104 is formed of a polymer-based material, which may be removed along with the carrier C1 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier C1, or may be the like. The top surface of the release layer 104 may be leveled and may have a high degree of planarity.

An insulating layer 402 and through vias 404 passing through the insulating layer 402 are formed on the release layer 104. For example, the insulating layer 402 is formed on the release layer 104 and then patterned to form plurals through holes, into which a conductive material is filled to form the through vias 404. In some embodiments, a planarization process, for example, a chemical-mechanical polish (CMP), a grinding process, or the like, is performed on the insulating layer 402 and the through vias 404 to expose the insulating layer 402 between the through vias 404. The insulating layer 402 and the through vias 404 may be deposited by CVD, PVD or the like. The patterning of the insulating layer 402 may use a photolithography process followed by an etching process to expose portions of the release layer 104.

Figure 21:
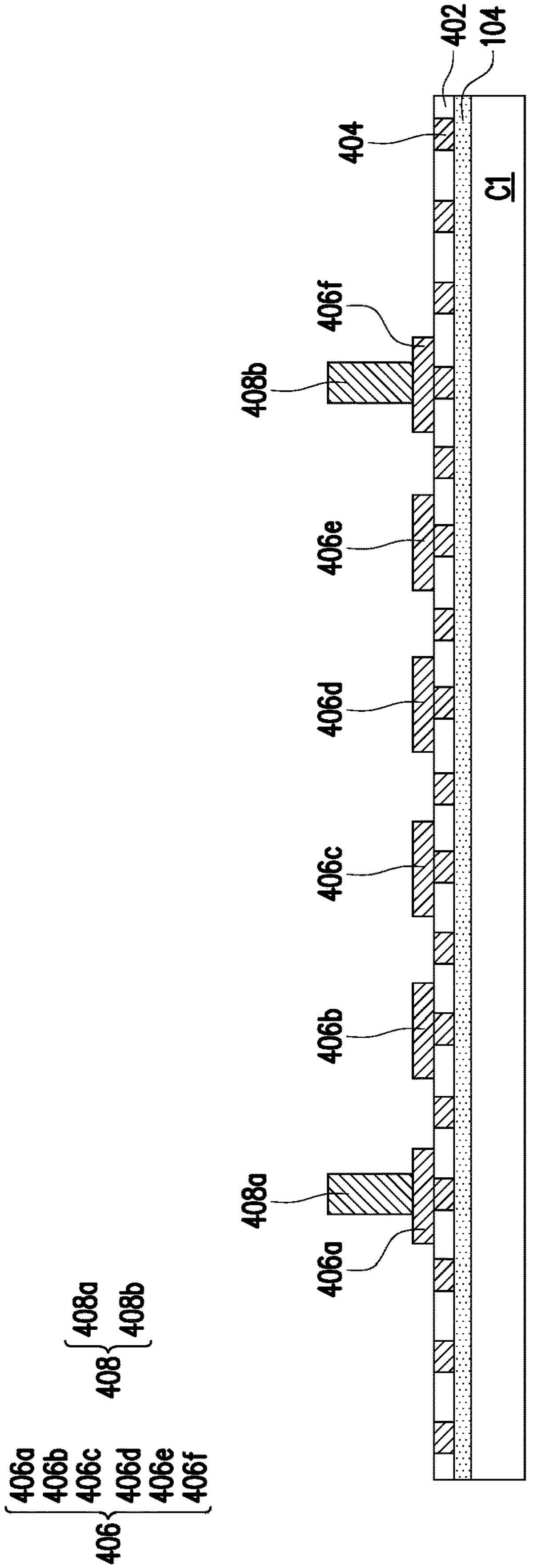

Referring to FIG. 21, contact pads 406 are formed over and electrically connected to portions of the through vias 404, and then the through vias 408 are formed on portions of the contact pads 406. For example, as shown in FIG. 21, the through vias 408*a* and 408*b* are formed on the contact pads 406*a* and 406*f* respectively, and the through vias 408 are not formed on the contact pads 406*b*, 406*c*, 406*d* and 406*e*. In some embodiments, a redistribution layer is formed between the contact pads 406 and the through vias 404.

Figure 22:
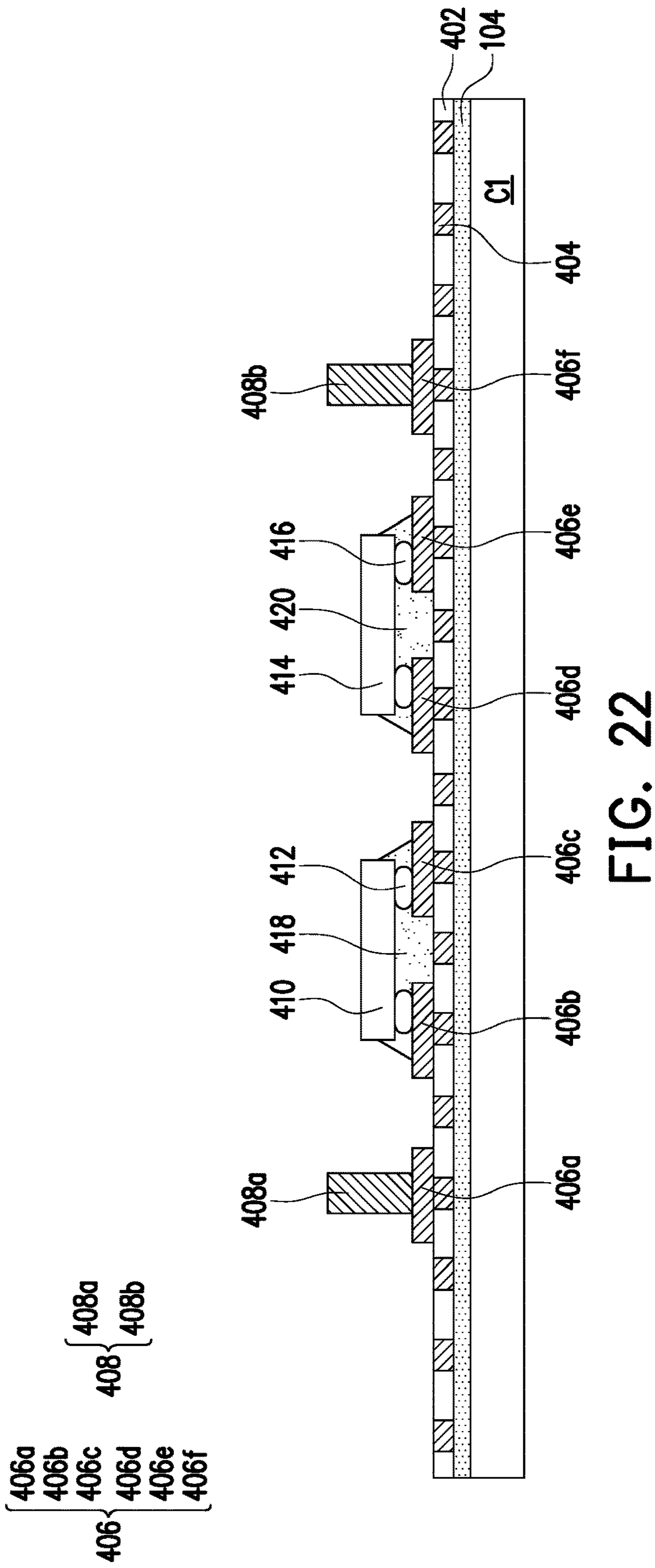

In FIG. 22, a semiconductor device 410 is bonded to the contact pads 406*b* and 406*c* through conductive connectors 412, such as solder balls or solder bumps. Similarly, a semiconductor device 414 is bonded to the contact pads 406*d* and 406*e* through conductive connectors 416, such as solder balls or solder bumps.

The semiconductor devices 410 and 414 may be or may comprise a passive device, such as a filter, an integrated passive device (IPD), a Si bridge, a Si bus, a resonator, a capacitor, a resistor, an inductor, or the like, or may include the combinations of the passive devices. An underfill 418 is formed between the semiconductor device 410 and the insulating layer 402 and the contact pads 406*b* and 406*c*, surrounding the conductive connectors 412. Similarly, an underfill 420 is formed between the semiconductor device 414 and the insulating layer 402 and the contact pads 406*d* and 406*e*, surrounding the conductive connectors 416. The underfills 418 and 420 may reduce stress and protect the joints resulting from the reflow of the conductive connectors 412 and 416. The underfills 418 and 420 may be formed by a capillary flow process after the semiconductor devices 410 and 414 are attached, or may be formed by a suitable dispensing method before the semiconductor devices 410 and 414 are attached.

Figure 23:
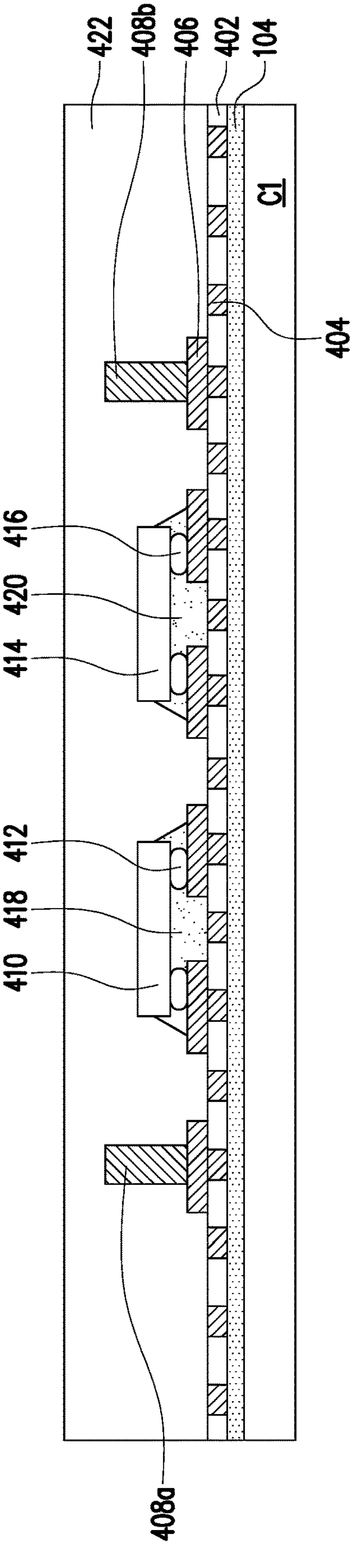

Referring to FIG. 23, an encapsulant 422 is formed on and around the various components so that the encapsulant 422 encapsulates the through vias 408*a* and 408*b* and the semiconductor devices 410 and 414. The encapsulant 422 may be a molding compound, epoxy, or the like. The encapsulant 422 may be applied by compression molding, transfer molding, or the like, and may be formed over the carrier C1 such that the through vias 408*a* and 408*b* and/or the semiconductor devices 410 and 414 are buried or covered. The encapsulant 422 is further formed in gap regions between the semiconductor devices 410 and 414, between the through vias 408*a* and the semiconductor devices 410, and between the semiconductor devices 414 and the through vias 408*b*. The encapsulant 422 may be applied in liquid or semi-liquid form and then subsequently cured.

Figure 24:
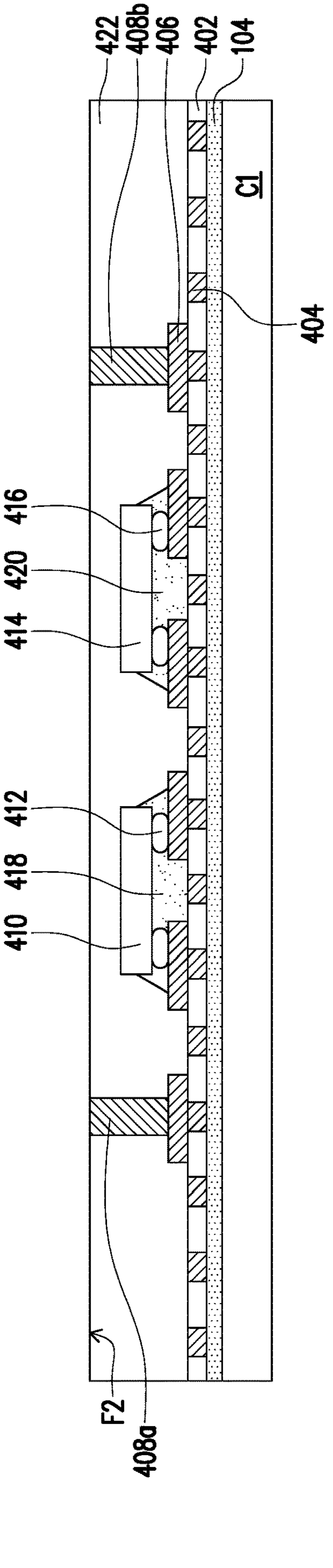

In FIG. 24, a planarization process is performed on the encapsulant 422 to expose the through vias 408*a* and 408*b*. Top surfaces of the through vias 408*a* and 408*b* and the encapsulant 422 are substantially coplanar after the planarization process. The planarization process may be a chemical-mechanical polish (CMP), a grinding process, or the like. In some embodiments, the planarization process is omitted if the through vias 408*a* and 408*b* are already exposed.

Figure 25:
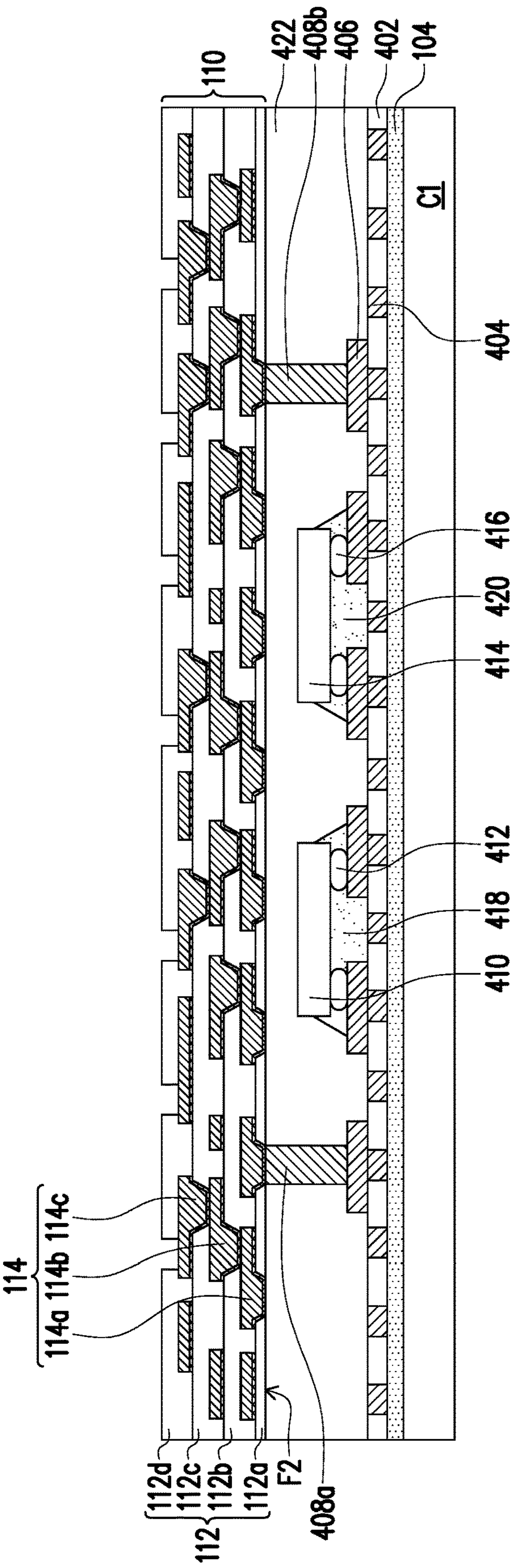

Referring to FIG. 25, the redistribution circuit structure 110 is formed on the encapsulant 422 and electrically connected to the through vias 408*a* and 408*b*. The formation of the redistribution circuit structure 110 may refer to the descriptions regarding FIG. 3 and will not be repeated again.

Figure 26:
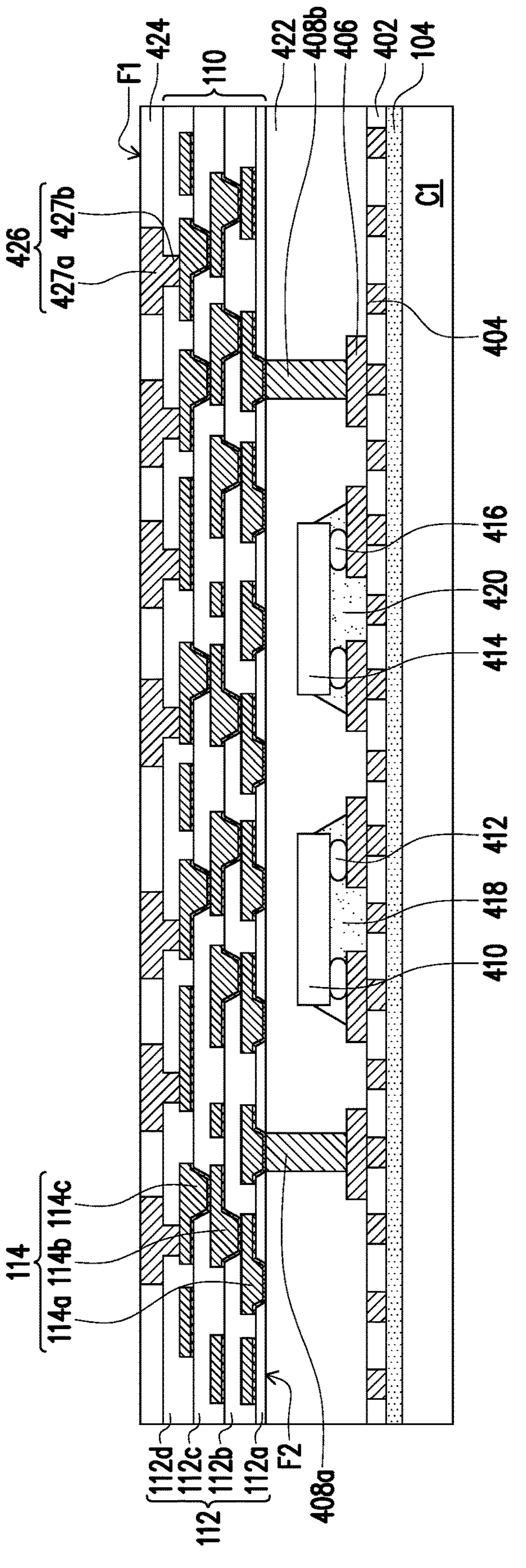

In FIG. 26, an insulating layer 424 is formed and patterned to expose the redistribution patterns 114*c* in the insulating layer 112*d*, and then redistribution patterns 426 of the redistribution circuit structure 110 are formed for connection to the redistribution patterns 114*c*. In some embodiments, the redistribution patterns 426 include under-bump metallurgies (UBMs) serving as contact pads for external connection to the redistribution circuit structure 110. For example, the redistribution patterns 426 include contact pads 427*a* on and extending along the major surface of the insulating layer 112*d*, and have via portions 427*b* extending through the insulating layer 112*d* to physically and electrically couple to the redistribution patterns 114*c*. In some embodiments, another redistribution layer (not shown) is formed between the redistribution pattern 426 and the redistribution circuit structure 110.

Figure 27:
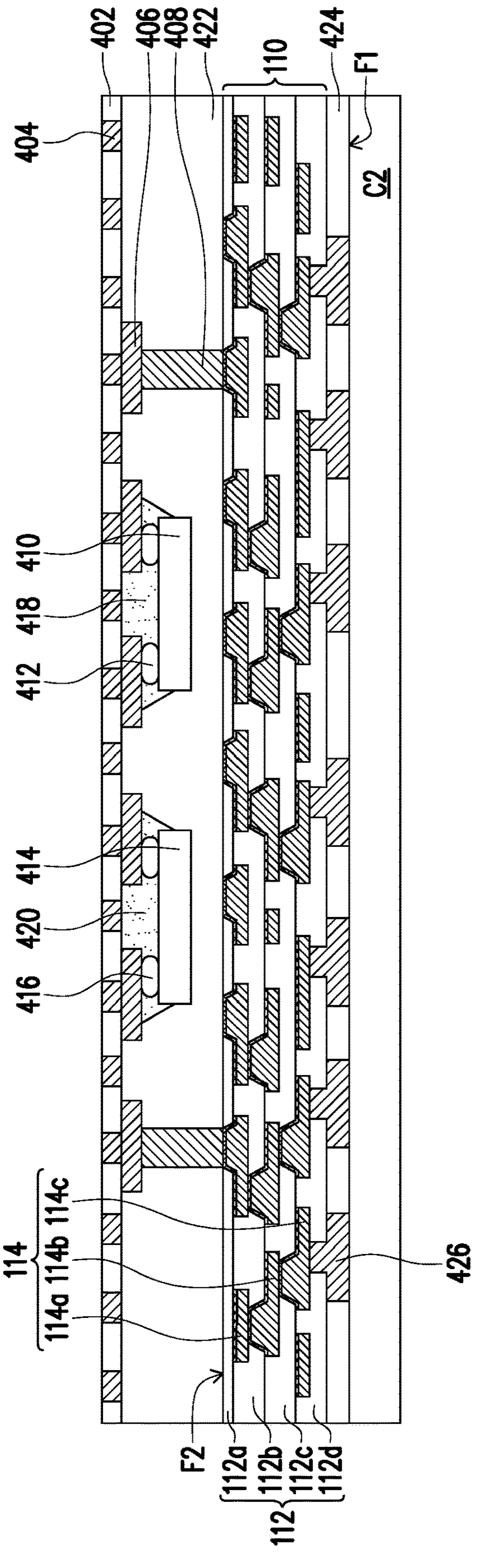

Referring to FIG. 27, a de-bonding process is performed such that a resulted structure including the insulating layer 402, the through vias 404, the contact pads 406, the through vias 408, the semiconductor devices 410 and 414, the redistribution circuit structure 110, the encapsulant 422 and the insulating layer 424 can be de-bonded from the carrier C1. After performing the de-bonding process, a carrier mount process is performed to mount the resulted structure on a carrier C2. The resulted structure de-bonded from the carrier C1 is flipped upside down and mounted onto the carrier C2 such that the through vias 404 are revealed.

Figure 28:
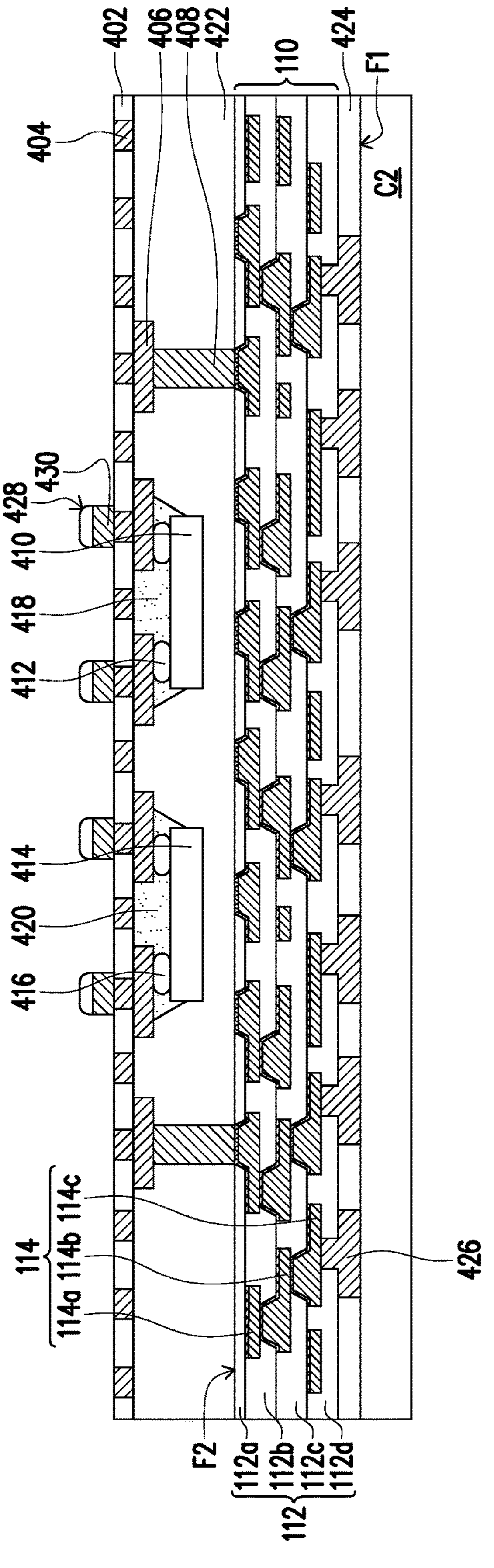

In FIG. 28, conductive terminals 428 are formed on portions of the through vias 404. The conductive terminals 428 may be solder balls, solder bumps, electroless nickel-electroless palladium-immersion gold technique (ENEPIG) formed bumps, or the like. The conductive terminals 428 may include controlled collapse chip connection (C4) bumps. The conductive terminals 428 may include a conductive material such as solder, copper, aluminum, gold, nickel, silver, palladium, tin, the like, or a combination thereof. In some embodiments, the conductive terminals 428 are formed by initially forming a layer of solder through evaporation, electroplating, printing, solder transfer, ball placement, or the like. Once a layer of solder has been formed on the structure, a reflow process may be performed in order to shape the material into the desired bump shapes. In another embodiment, the conductive terminals 428 comprise metal pillars 430 (such as a copper pillar) formed by sputtering, printing, electro plating, electroless plating, CVD, or the like. The metal pillars 430 may be solder free and have substantially vertical sidewalls.

Figure 29:
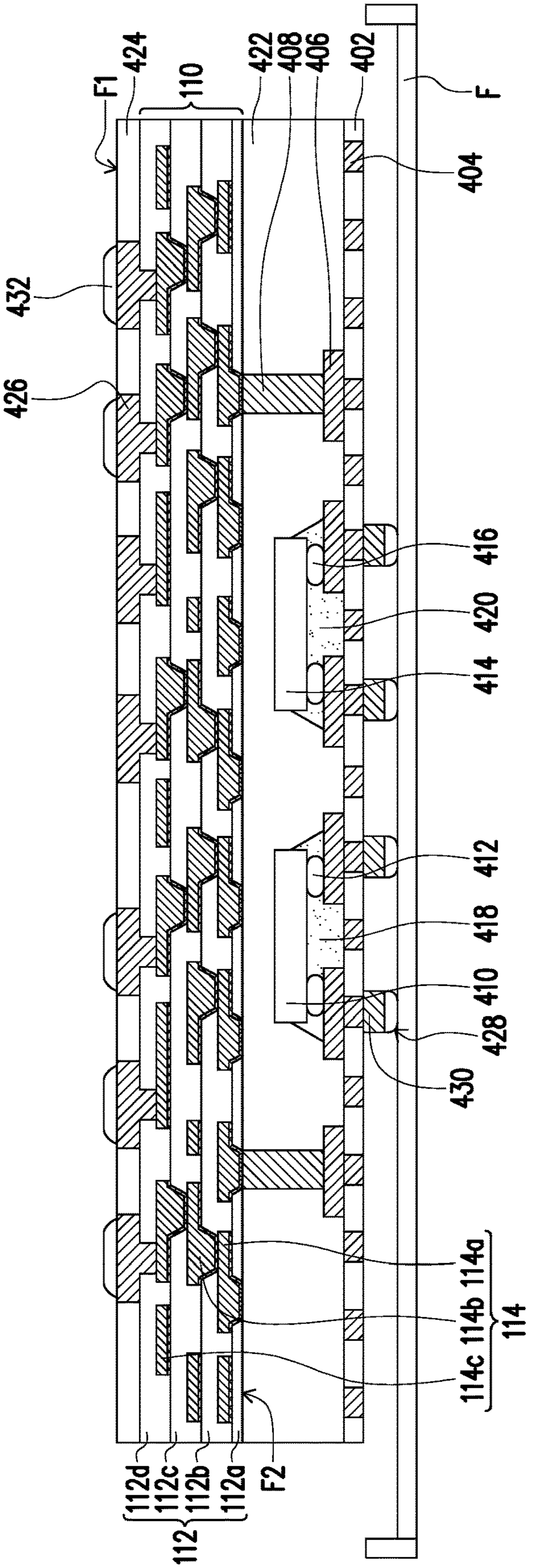

Referring to FIG. 29, a de-bonding process is performed such that a resulted structure including the insulating layer 402, the through vias 404, the contact pads 406, the through vias 408, the semiconductor devices 410 and 414, the redistribution circuit structure 110, the encapsulant 422, the insulating layer 424 and the conductive terminals 428 can be de-bonded from the carrier C2. After performing the de-bonding process, a frame mount process is performed to mount the resulted structure on a frame F. The resulted structure de-bonded from the carrier C2 is flipped upside down and mounted onto the frame F such that the redistribution patterns 426 are revealed.

After the frame mount process, solder caps 432 are formed on portions of the redistribution patterns 426, except the redistribution patterns 426 where a semiconductor device will be attached to. The solder cap 432 electrically connects the conductive pillar 408 to the contact pad 427*a*. The solder cap 432 may be solder balls, solder bumps, electroless nickel-electroless palladium-immersion gold technique (ENEPIG) formed bumps, or the like. The solder cap 432 may include a conductive material such as solder, copper, aluminum, gold, nickel, silver, palladium, tin, the like, or a combination thereof. In some embodiments, the solder cap 432 are formed by initially forming a layer of solder through evaporation, electroplating, printing, solder transfer, ball placement, or the like.

Figure 30:
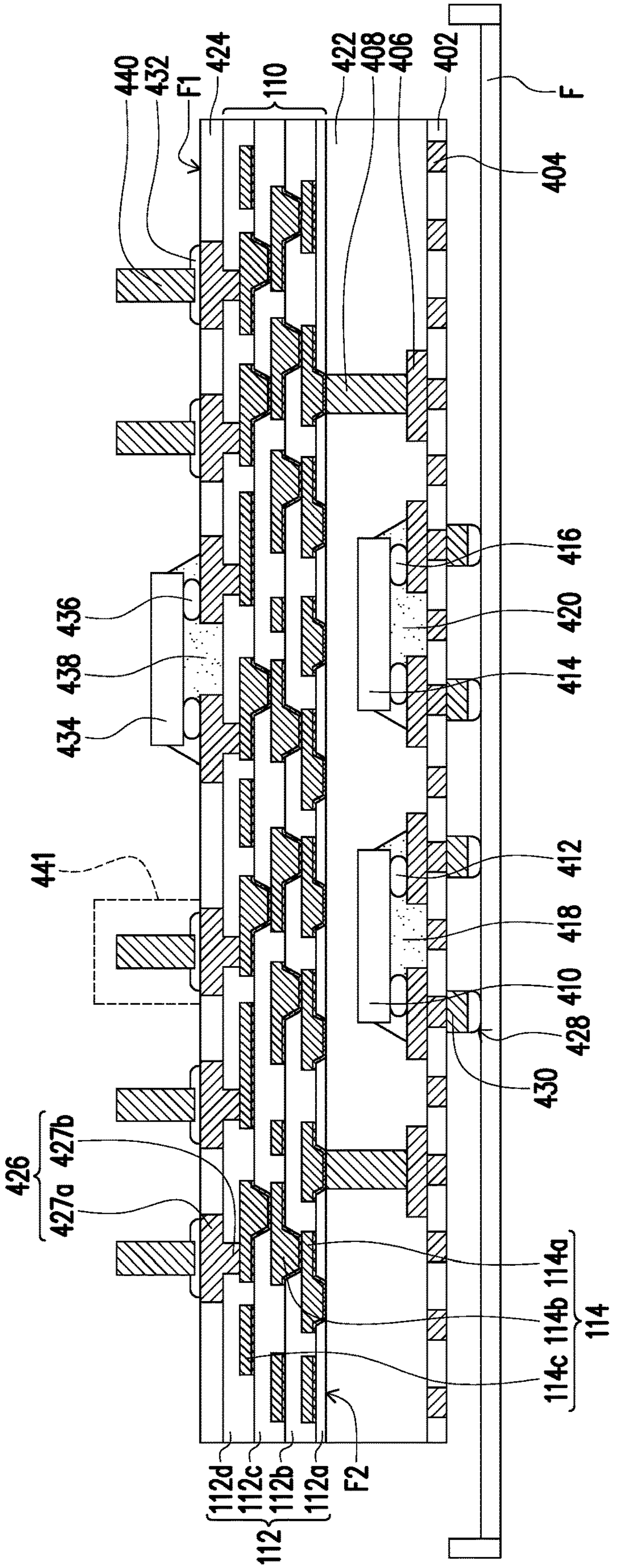
Figure 31A:
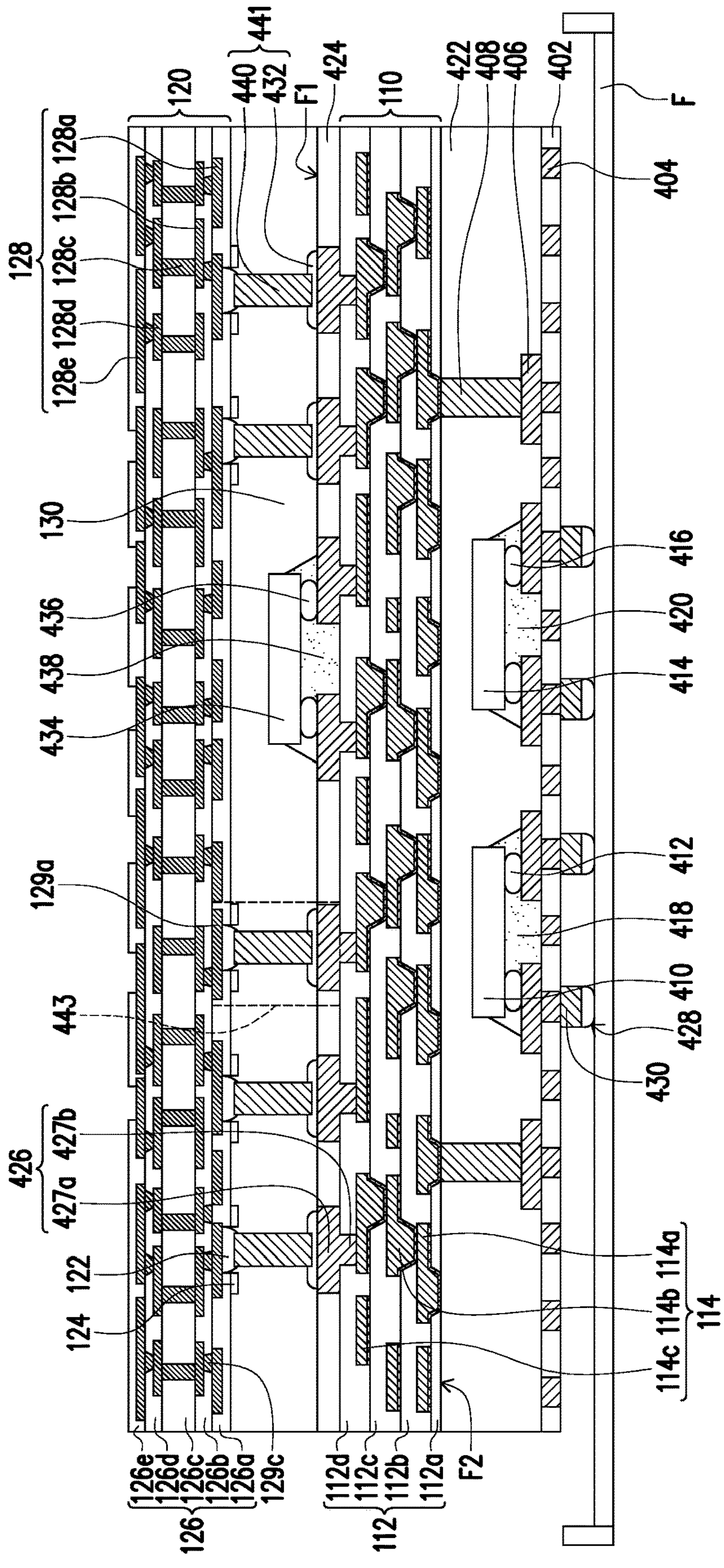
Figure 31B:
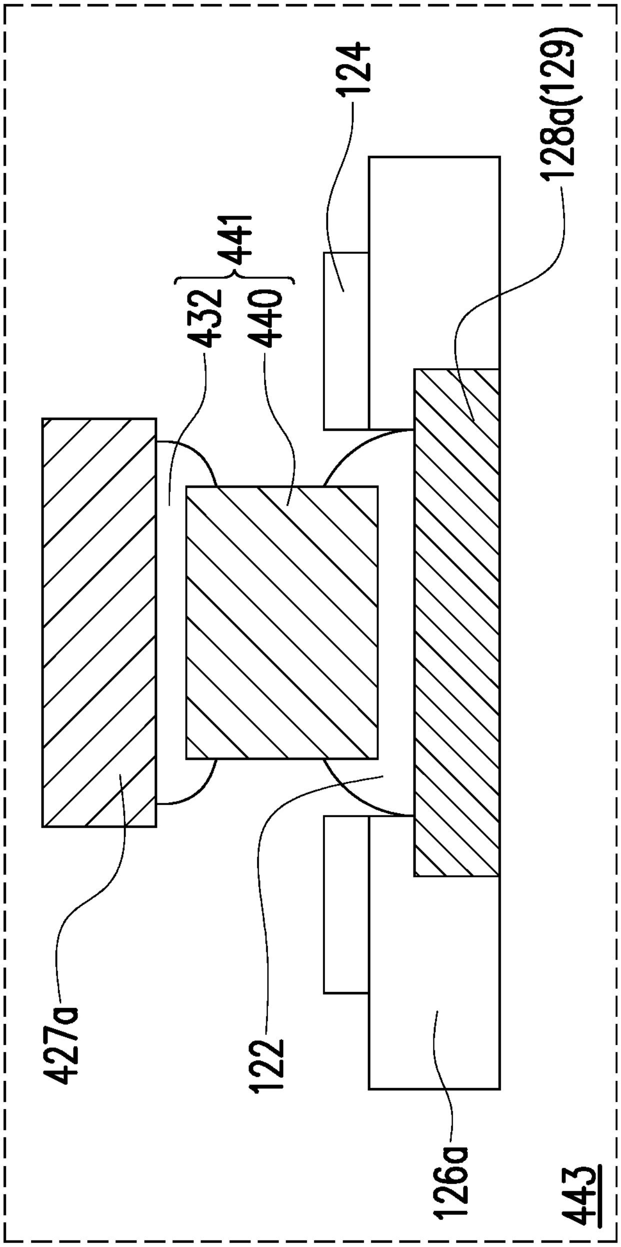
Figure 32:
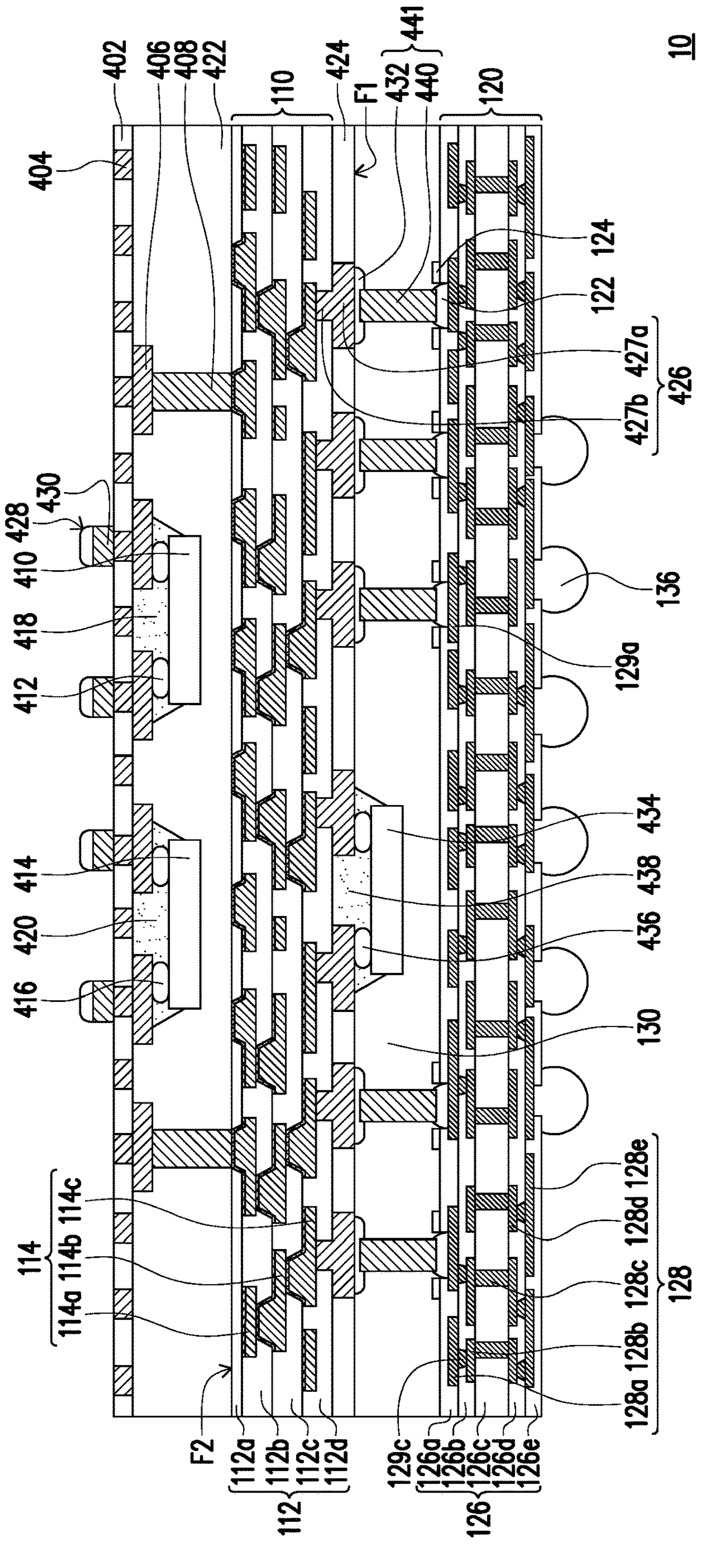

In FIG. 30, a semiconductor device 434 is attached to the redistribution patterns 426 through conductive connectors 436, such as solder balls or solder bumps. The semiconductor device 434 may be or may comprise a passive device, such as a filter, an integrated passive device (IPD), a Si bridge, a Si bus, a resonator, a capacitor, a resistor, an inductor, or the like, or may include the combinations of the passive devices. An underfill 438 is formed between the semiconductor device 434 and the insulating layer 424, surrounding the conductive connectors 436. The underfill 438 may reduce stress and protect the joints resulting from the reflow of the conductive connectors 436. The underfill 438 may be formed by a capillary flow process after the semiconductor device 434 is attached, or may be formed by a suitable dispensing method before the semiconductor device 434 is attached.

As illustrated in FIG. 30, conductive pillars 440 are formed on the solder cap 432 such that the conductive pillars 440 are disposed over portions of the contact pads 427*a*. One solder cap 432 and one conductive pillars 440 are collectively referred to as conductive terminal 441. The conductive pillars 440 may include a conductive material such as solder, copper, aluminum, gold, nickel, silver, palladium, tin, the like, or a combination thereof. In some embodiments, the conductive pillars 440 comprise metal pillars (such as a copper pillar) formed by sputtering, printing, electro plating, electroless plating, CVD, or the like. The metal pillars may be solder free and have substantially vertical sidewalls. In some embodiments, the conductive pillars 440 are preformed and placed on the solder cap 432 respectively through a stencil printing process. In some embodiments, a melting point of the conductive pillar 440 is higher than a melting point of the solder cap 432.

Figure 13:
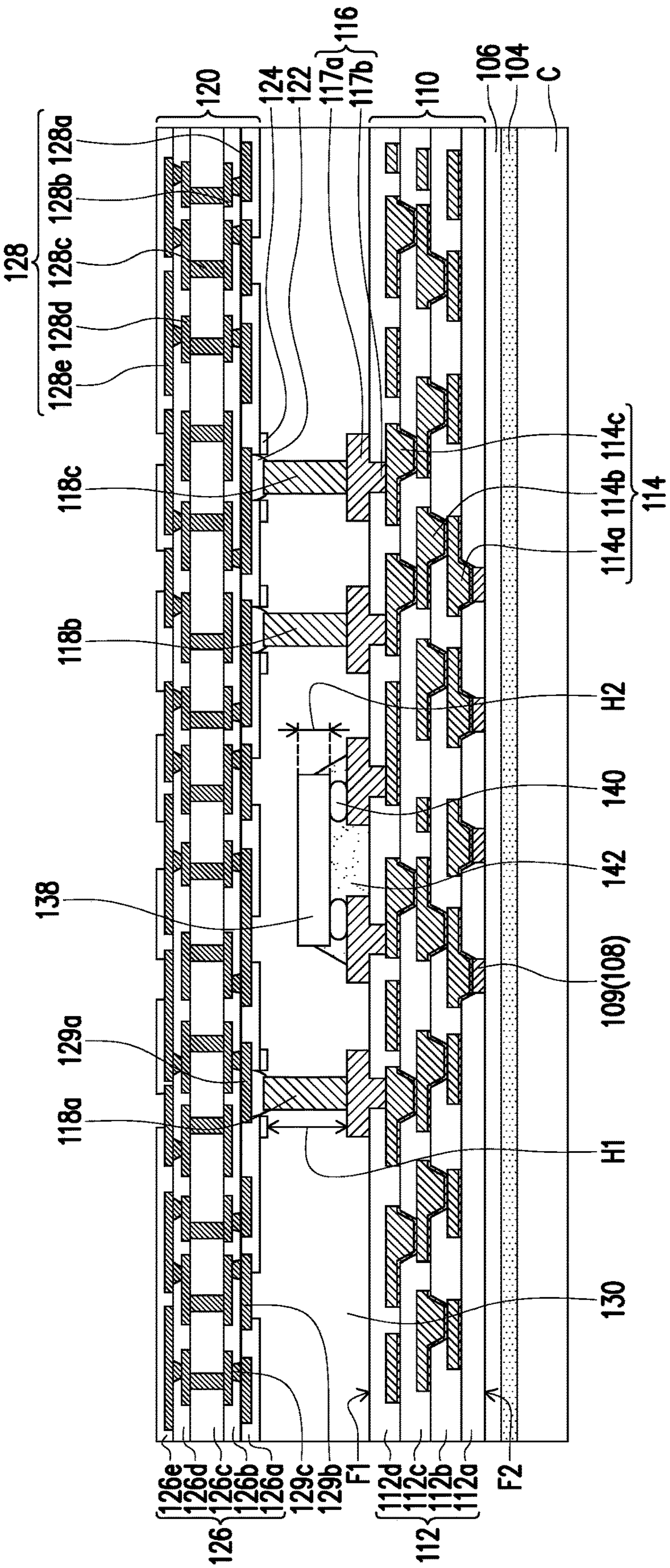
Figure 14:
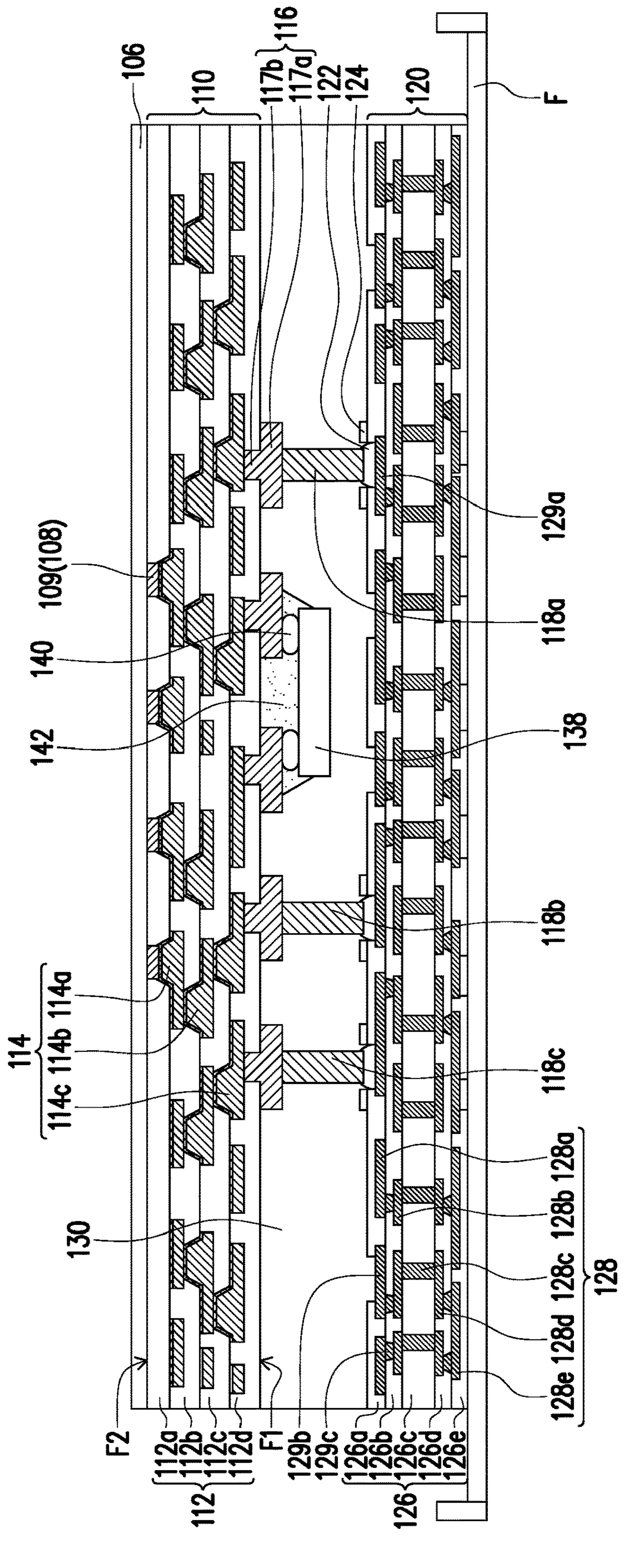
Figure 15:
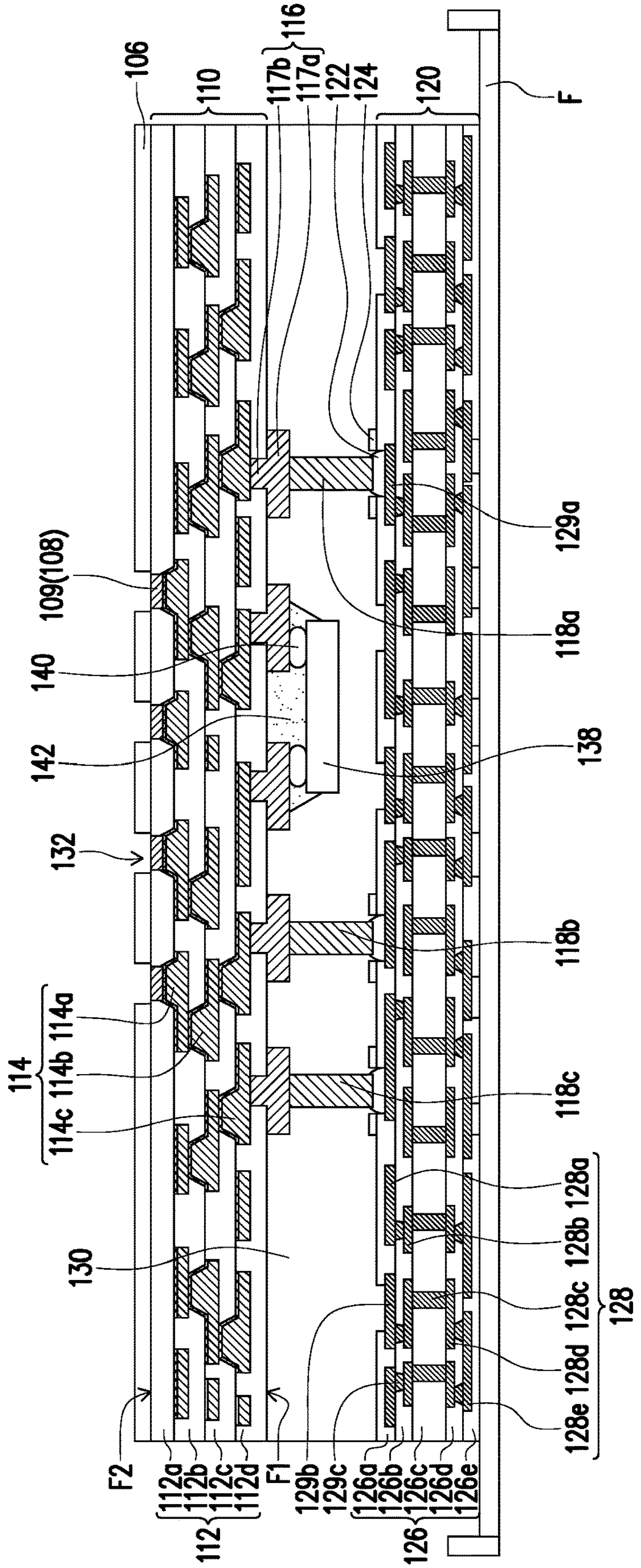

Processes illustrated in FIG. 31A through FIG. 33 are similar to those illustrated in FIG. 13, FIG. 17 and FIG. 18, and descriptions regarding to the processes illustrated in FIG. 31A through FIG. 33 are thus omitted. It is noted that one contact pad 427*a*, one conductive terminal 441 and the solder material 122 are collectively referred to as interconnect structure 443, which may function as a support structure of a package structure 40 as discussed in detail below. FIG. 31B shows the interconnect structure 443 in greater detail, which includes the contact pad 427*a* of the redistribution pattern 426, the solder cap 432, the conductive pillar 440 and the solder material 122 stacked on the redistribution pattern 128*a* embedded in the insulating layer 126*a* of the wiring substrate 120.

Figure 33:
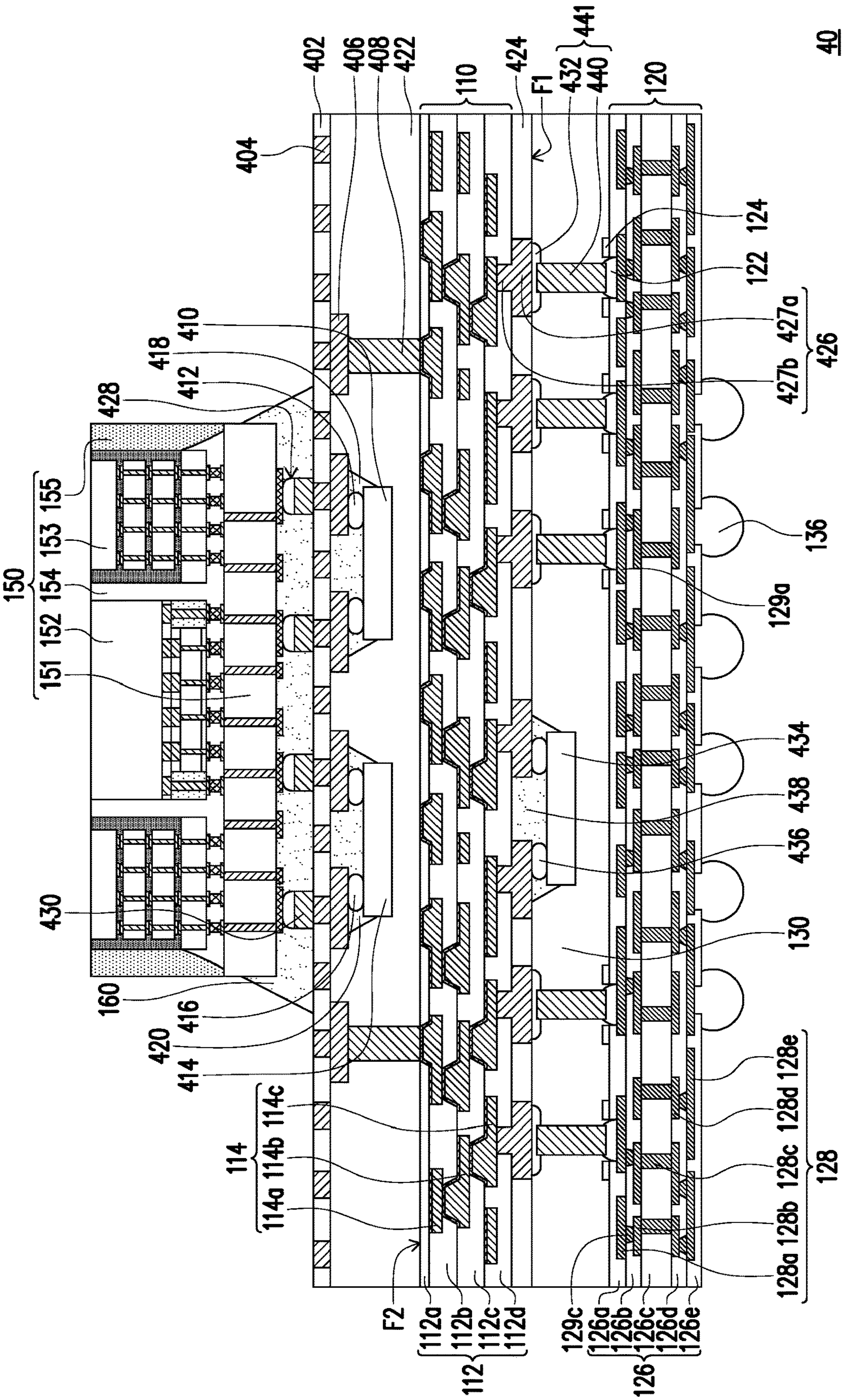

As illustrated in FIG. 33, the package structure 40 includes a redistribution circuit structure 110, a wiring substrate 120, a conductive terminal 441 and a chip package 150. The redistribution circuit structure 110 has the first surface F1 and the second surface F2 opposite to the first surface F1 and comprises the contact pads 427*a* disposed at the first surface F1. The wiring substrate 120 is disposed opposite the first surface F1 of the redistribution circuit structure 110 and includes the contact pad 129*a* facing the contact pad 427*a*. The conductive terminal 441 includes a solder cap 432 and a conductive pillar 440, wherein the solder cap 432 covers a portion of the contact pad 427*a* and electrically connects the conductive pillar 440 with the contact pad 427*a*, and the conductive pillar 440 electrically connects the solder cap 432 with the contact pad 129*a*. In some embodiments, the package structure 40 does not include the solder cap 432, and the conductive pillar 440 is bonded to the contact pad 427*a* directly.

The chip package 150 is disposed over the second surface F2 of the redistribution circuit structure 110, wherein the chip package 150 is electrically connected to the wiring substrate 120 through the redistribution circuit structure 110. Due to the conductive pillars 440, the co-planarity of the integrated structure including the redistribution circuit structure 110 and the wiring substrate 120 can be improved, resulting in enhanced join yield of the chip package 150 as well as reliability of the package structure 40. In some embodiments, the package structure 40 is also referred to as a Chip-on-Wafer-on-Substrate (CoWoS) package.

Figure 34:
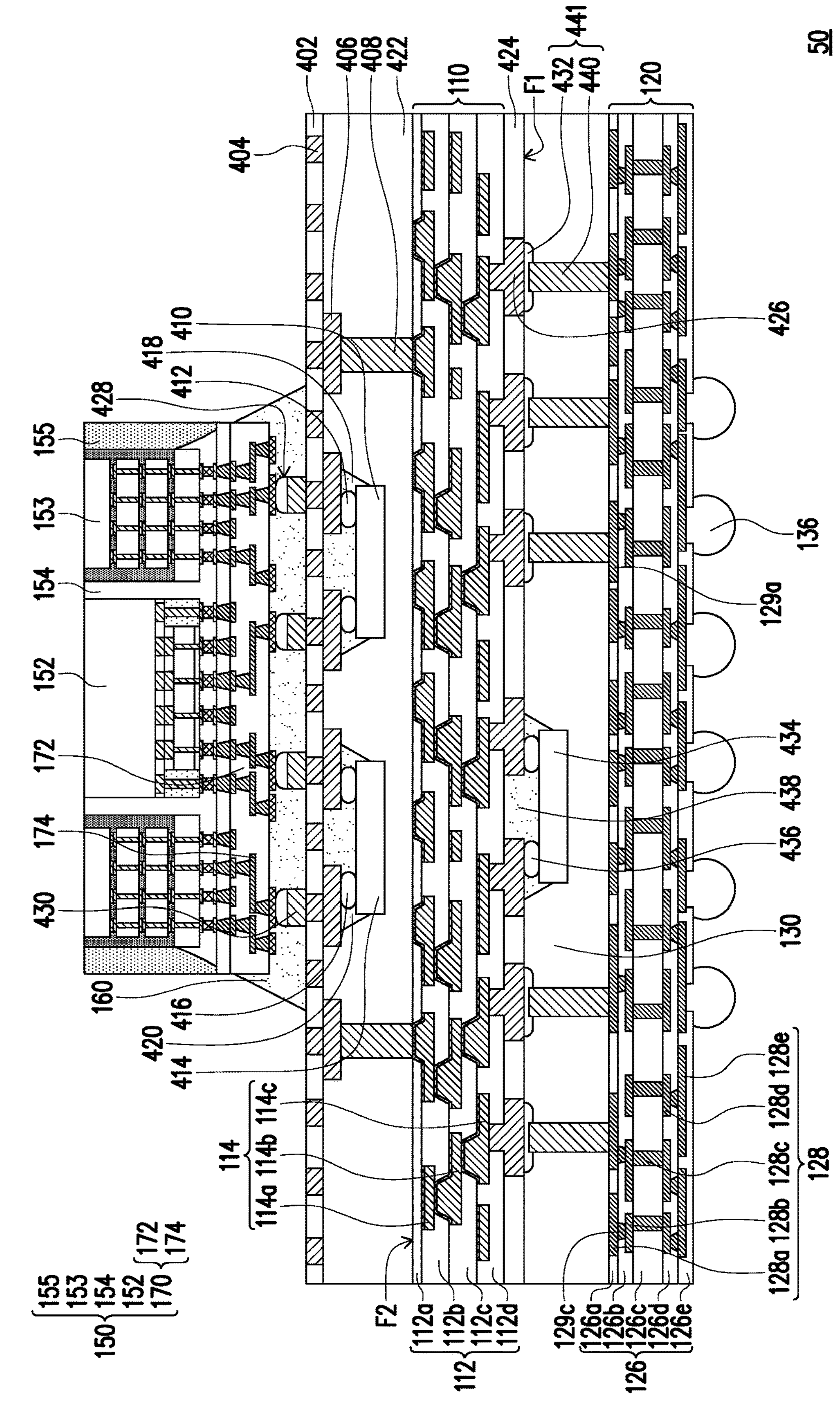
FIG. 34 is a cross-sectional view schematically illustrating a package structure in accordance with the fifth embodiment of the present disclosure.

FIG. 34 is a cross-sectional view schematically illustrating a package structure in accordance with the fifth embodiment of the present disclosure.

Referring to FIG. 33 and FIG. 34, the package structure 50 illustrated in FIG. 34 is similar to the package structure 40 illustrated in FIG. 33 except that the interposer 151 is replaced with an integration fan-out redistribution layer (InFO RDL) 170. The InFO RDL layer 170 support electrical signals and can be used to connect the semiconductor chip 152 and memory cubes 153 with the conductive terminals 428. The InFO RDL 170 provides electrical connections for the redistribution circuit structure 110 through the conductive terminals 428, the through vias 404, the contact pads 406 and the through vias 408 on the second surface F2 of the redistribution circuit structure 110.

In some embodiments, the conductive pillar 440 is directly bonded to the redistribution pattern 128*a* of the wiring substrate 120 without the solder material 122. For example, the conductive pillar 440 is bonded to the redistribution pattern 128*a* before the wiring substrate 120 is provided over the redistribution circuit structure 110.

Figure 35:
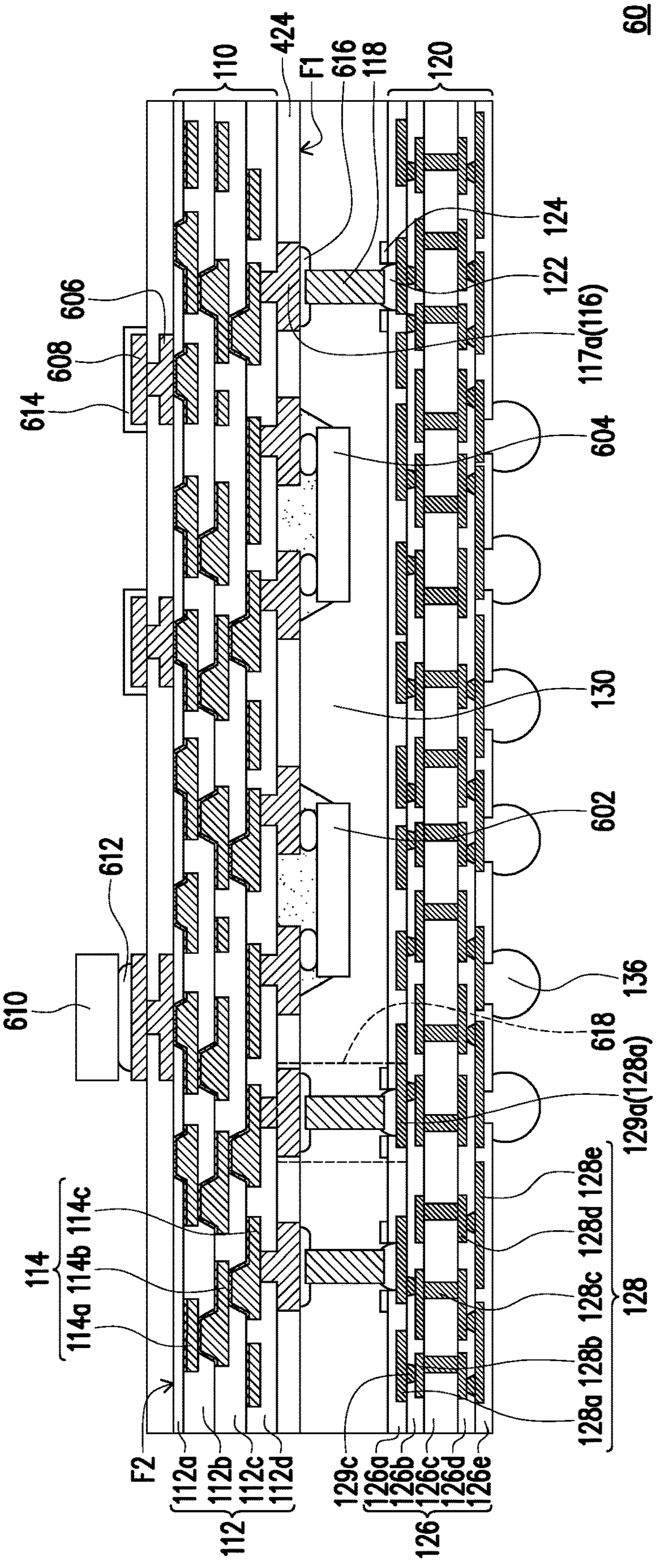
FIG. 35 is a cross-sectional view schematically illustrating a package structure in accordance with the six embodiment of the present disclosure.

FIG. 35 is a cross-sectional view schematically illustrating a package structure in accordance with the sixth embodiment of the present disclosure.

Referring to FIG. 35, the package structure 60 illustrated in FIG. 35 is similar to the package structure 10 illustrated in FIG. 10 except that the package structure 60 further comprises semiconductor devices 602 and 604 mounted on portions of the redistribution patterns 116 and disposed between the redistribution circuit structure 110 and the wiring substrate 120, conductive wirings 606 formed between the redistribution patterns 114*a* of the redistribution circuit structure 110 and the conductive terminals 608 respectively, and a capacitor device 610 bonded to the conductive terminal 608 through a bonding material 612. In some embodiments, the semiconductor device 602 is a filter, the semiconductor device 604 is an integrated passive device (IPD), and the capacitor device 610 is a multi-layer ceramic capacitor (MLCC). In some embodiments, the package structure 60 comprises a probe card and serves as an interface between devices under test (DUT such as chips on a wafer) and a test head of automatic test equipment (ATE). The resulting electrical signals generated from each chip or DUT are captured and analyzed by the automatic test equipment (ATE) having test circuitry to determine if a chip or DUT has a defect. In some embodiments, the package structure 60 further comprises a solder cap 614 covering the conductive terminal 608 for preventing damage or collapse of the conductive terminal 608 during tests. In certain embodiments, the package structure 60 further comprises a solder cap 616 sandwiched between the redistribution pattern 116 and the conductive pillar 118. In some embodiments, the package structure 60 has a surface area from approximately 100 $mm^2$ to 150 $mm^2$, such as around 120 $mm^2$. Due to the conductive pillar 118, a predetermined distance is maintained between the redistribution circuit structure 110 and the wiring substrate 120, thereby enabling the position of the semiconductor devices 602 and 604 between the redistribution circuit structure 110 and the wiring substrate 120 as well as achieving an enhanced join yield between the redistribution circuit structure 110 and the wiring substrate 120.

In accordance with some embodiments of the disclosure, a package structure including a redistribution circuit structure, a wiring substrate, a conductive pillar and a solder material is provided. The redistribution circuit structure has a first surface and a second surface opposite to the first surface. The redistribution circuit structure includes a first insulating layer and a first redistribution pattern in the first insulating layer. The first redistribution pattern comprises a first contact pad disposed at the first surface. The wiring substrate is disposed opposite the first surface of the redistribution circuit structure. The wiring substrate includes a second insulating layer and a second redistribution pattern in the second insulating layer. The second redistribution pattern comprises a second contact pad. The conductive pillar is disposed between the first contact pad and the second contact pad. The solder material is disposed between the conductive pillar and the second contact pad. In some embodiments, a melting point of the conductive pillar is higher than a melting point of the solder material. In some embodiments, the package structure further includes a solder resist surrounding the solder material. In some embodiments, the package structure further includes a solder cap electrically connecting the conductive pillar with the first contact pad. In some embodiments, the package structure further includes an insulating encapsulation disposed between the redistribution circuit structure and the wiring substrate and laterally encapsulating the conductive pillars and the solder material. In some embodiments, the package structure further includes a semiconductor device disposed between the redistribution circuit structure and the wiring substrate. In some embodiments, a height of the conductive pillar is greater than a height of the semiconductor device.

In accordance with some other embodiments of the disclosure, a package structure including a redistribution circuit structure, a wiring substrate, a conductive terminal and a chip package is provided. The redistribution circuit structure has a first surface and a second surface opposite to the first surface, and includes a first contact pad disposed at the first surface. The wiring substrate is disposed opposite the first surface of the redistribution circuit structure and includes a second contact pad facing the first contact pad. The conductive terminal includes a solder cap covering the first contact pad and a conductive pillar electrically connecting the solder cap to the second contact pad. The chip package is disposed over the second surface of the redistribution circuit structure, wherein the chip package is electrically connected to the wiring substrate through the redistribution circuit structure. In some embodiments, a melting point of the conductive pillar is higher than a melting point of the solder cap. In some embodiments, the chip package comprises an interposer and a chip disposed on and electrically connected to the interposer, and the chip is electrically connected to the redistribution circuit structure through the interposer. In some embodiments, the chip package comprises a fan-out package. In some embodiments, the package structure further includes a solder material disposed between the conductive pillar and the second contact pad. In some embodiments, the package structure comprises a probe card.

In accordance with some other embodiments of the disclosure, a method for fabricating a package structure is provided. A redistribution circuit structure having a first surface and a second surface opposite to the first surface is provided. The redistribution circuit structure comprises a first contact pad at the first surface. A conductive pillar is formed over the first contact pad. The conductive pillar is electrically connected to the first contact pad. A wiring substrate is mounted over the first surface of the redistribution circuit structure, wherein the wiring substrate comprises a second contact pad electrically connected to the first contact pad through the conductive pillar. In some embodiments, mounting the wiring substrate over the first surface of the redistribution circuit structure includes disposing a solder material on the second contact pad of the wiring substrate; placing the wiring substrate onto the first surface of the redistribution circuit structure such that the solder material contacts the conductive pillar; and performing a reflow process. In some embodiments, the conductive pillar is formed over the first contact pad by stencil printing. In some embodiments, the method for fabricating a package structure further includes disposing a solder cap over the first contact pad before forming the conductive pillar over the first contact pad. In some embodiments, the solder cap is disposed over the first contact pad by stencil printing. In some embodiments, the method for fabricating a package structure further includes mounting a semiconductor device over the first surface of the redistribution circuit structure before mounting the wiring substrate. In some embodiments, the method for fabricating a package structure further includes forming an insulating encapsulation between the redistribution circuit structure and the wiring substrate to laterally encapsulate the conductive pillar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a package structure, comprising:
- providing a redistribution circuit structure having a first surface and a second surface opposite to the first surface, wherein the redistribution circuit structure comprises a first contact pad at the first surface;
- forming a conductive pillar over the first contact pad, wherein the conductive pillar is electrically connected to the first contact pad;
- mounting a wiring substrate over the first surface of the redistribution circuit structure, wherein mounting the wiring substrate over the first surface of the redistribution circuit structure comprises:
  - disposing a solder material on a second contact pad of the wiring substrate, wherein the solder material and the second contact pad are in an insulating layer of the wiring substrate;
  - placing the wiring substrate onto the first surface of the redistribution circuit structure such that the conductive pillar protrudes into the solder material; and
  - performing a reflow process; and
- after mounting the wiring substrate over the first surface of the redistribution circuit structure, forming an insulating encapsulation between the redistribution circuit structure and the wiring substrate to laterally encapsulate the conductive pillar and the solder material, wherein the conductive pillar comprises a first portion embedded in the solder material and a second portion embedded in the insulating encapsulation.

2. The method for fabricating a package structure as claimed in claim 1, wherein the insulating layer comprises an opening for revealing a portion of the second contact pad, and the solder material is disposed in the opening and on the portion of the second contact pad.

3. The method for fabricating a package structure as claimed in claim 1, wherein the conductive pillar is formed over the first contact pad by stencil printing.

4. The method for fabricating a package structure as claimed in claim 1 further comprising disposing a solder cap over the first contact pad before forming the conductive pillar over the first contact pad.

5. The method for fabricating a package structure as claimed in claim 4, wherein the solder cap is disposed over the first contact pad by stencil printing.

6. The method for fabricating a package structure as claimed in claim 1 further comprising mounting a semiconductor device over the first surface of the redistribution circuit structure before mounting the wiring substrate.

7. The method for fabricating a package structure as claimed in claim 1, wherein the redistribution circuit structure is provided over a carrier, and the second surface is in contact with the carrier.

8. The method for fabricating a package structure as claimed in claim 7 further comprising:
- de-bonding the redistribution circuit structure from the carrier to reveal the second surface of the redistribution circuit structure.

9. The method for fabricating a package structure as claimed in claim 8 further comprising:
- forming a first conductive terminal over a third contact pad at the second surface of the redistribution circuit structure after de-bonding the redistribution circuit structure from the carrier.

10. The method for fabricating a package structure as claimed in claim 8 further comprising:
- forming a second conductive terminal electrically connected to the second contact pad of the wiring substrate.

11. A method, comprising:
- forming a redistribution circuit structure comprising first contact pads;
- forming conductive pillars over the first contact pads of the redistribution circuit structure;
- forming a solder material on second contact pads of a wiring substrate;
- pressing the conductive pillars into the solder material and reflowing the solder material such that a space is formed between the redistribution circuit structure and the wiring substrate; and
- filling the space between the redistribution circuit structure and the wiring substrate with an insulating encapsulation to encapsulate the conductive pillars and the solder material, wherein the insulating encapsulation interfaces and extends along sidewalls of the solder material, the conductive pillars and the first contact pads.

12. The method for fabricating a package structure as claimed in claim 11 further comprising:

providing a carrier having a release layer formed thereon, wherein the release layer is between the redistribution circuit structure and the carrier.

13. The method for fabricating a package structure as claimed in claim 12 further comprising:

forming a dielectric layer over the release layer before forming the redistribution circuit structure, wherein the first contact pads of the redistribution circuit structure are formed to be in contact with the dielectric layer.

14. The method for fabricating a package structure as claimed in claim 13 further comprising:

after filling the space between the redistribution circuit structure and the wiring substrate with the insulating encapsulation, performing a de-bonding process to de-bond the dielectric layer from the release layer.

15. The method for fabricating a package structure as claimed in claim 14, further comprising:

after performing the de-bonding process, patterning the dielectric layer to reveal the first contact pads of the redistribution circuit structure; and forming first conductive terminals electrically connected to the first contact pads of the redistribution circuit structure.

16. The method for fabricating a package structure as claimed in claim 15 further comprising:

forming second conductive terminal electrically connected to the second contact pads of the wiring substrate.

17. A method, comprising:

forming a redistribution circuit structure comprising first contact pads;

forming conductive pillars and a semiconductor device over the first contact pads of the redistribution circuit structure;

forming a solder material on second contact pads of a wiring substrate;

forming a solder resist on an insulating layer of the wiring substrate, wherein the second contact pads are in the insulating layer;

placing the wiring substrate onto the redistribution circuit structure and pressing the conductive pillars into the solder material;

bonding the redistribution circuit structure and the wiring substrate through the joint of the conductive pillars and the solder material, wherein the solder resist laterally surrounds the solder material and the conductive pillars; and after bonding the conductive pillars with the solder material, forming an insulating encapsulation between the redistribution circuit structure and the wiring substrate, wherein the insulating encapsulation encapsulates the conductive pillars, the solder material and the solder resist.

18. The method as claimed in claim 17 further comprising:

forming conductive terminals electrically connected to the redistribution circuit structure.

19. The method as claimed in claim 18 further comprising:

providing a chip package over the redistribution circuit structure, wherein the chip package is electrically connected to the redistribution circuit structure.

20. The method as claimed in claim 17 further comprising disposing a solder cap over the first contact pads before forming the conductive pillars over the first contact pads.

* * * * *